United States Patent
Chiang et al.

(10) Patent No.: US 11,005,572 B1
(45) Date of Patent: May 11, 2021

(54) TEMPERATURE-LOCKED LOOP FOR OPTICAL ELEMENTS HAVING A TEMPERATURE-DEPENDENT RESPONSE

(71) Applicant: XILINX, INC., San Jose, CA (US)

(72) Inventors: Ping Chuan Chiang, Campbell, CA (US); Mayank Raj, San Jose, CA (US); Chuan Xie, Fremont, CA (US); Stanley Y. Chen, Cupertino, CA (US); Sandeep Kumar, Punggol (SG); Sukruth Pattanagiri, Singapore (SG); Parag Upadhyaya, Los Gatos, CA (US); Yohan Frans, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/093,399

(22) Filed: Nov. 9, 2020

(51) Int. Cl.
*H04B 10/69* (2013.01)
*H03L 1/02* (2006.01)
*H03L 7/189* (2006.01)

(52) U.S. Cl.
CPC .......... *H04B 10/6911* (2013.01); *H03L 1/022* (2013.01); *H03L 7/189* (2013.01)

(58) Field of Classification Search
CPC ...... H04B 10/6911; H03L 1/022; H03L 7/189
USPC ........................................................ 327/156
See application file for complete search history.

(56) References Cited

U.S. PATENT DOCUMENTS

| | | | | |
|---|---|---|---|---|
| 6,342,694 B1* | 1/2002 | Satoh | ............... | H03G 3/3084 250/214 A |
| 9,989,785 B2* | 6/2018 | Amberg | ............... | G02F 1/0121 |
| 10,281,747 B2 | 5/2019 | Padmaraju et al. | | |
| 10,432,315 B2* | 10/2019 | Chen | ............... | G02F 1/0121 |
| 2010/0200733 A1* | 8/2010 | McLaren | ............... | G02F 1/025 250/214 C |
| 2011/0135315 A1* | 6/2011 | Liu | ............... | H04B 10/6911 398/162 |
| 2014/0037286 A1* | 2/2014 | Krasulick | ............... | H04B 10/5561 398/38 |
| 2014/0099105 A1* | 4/2014 | Yan | ............... | H04B 10/07955 398/38 |
| 2015/0263190 A1* | 9/2015 | Knights | ............... | G02F 1/0147 250/201.1 |

OTHER PUBLICATIONS

Padmaraju, Kishore, et al., "Wavelength Locking and Thermally Stabilizing Microring Resonators Using Dithering Signals," Journal of Lightwave Technology, vol. 32, No. 3, Feb. 1, 2014, p. 505-512.

* cited by examiner

*Primary Examiner* — Tomi Skibinski
(74) *Attorney, Agent, or Firm* — Patterson + Sheridan, LLP

(57) ABSTRACT

Examples described herein generally relate to a temperature-locked loop for optical elements. In an example, a device includes a controller and a digital-to-analog converter (DAC). The controller includes a DC-controllable transimpedance stage (DCTS), a slicer circuit, and a processor. The DCTS is configured to be coupled to a photodiode. An input node of the slicer circuit is coupled to an output node of the DCTS. The processor has an input node coupled to an output node of the slicer circuit. The DAC has an input node coupled to an output node of the processor and is configured to be coupled to a heater. The processor is configured to control (i) the DCTS to reduce a DC component of a signal on the output node of the DCTS and (ii) an output voltage on the output node of the DAC, both based on a signal output by the slicer circuit.

20 Claims, 14 Drawing Sheets

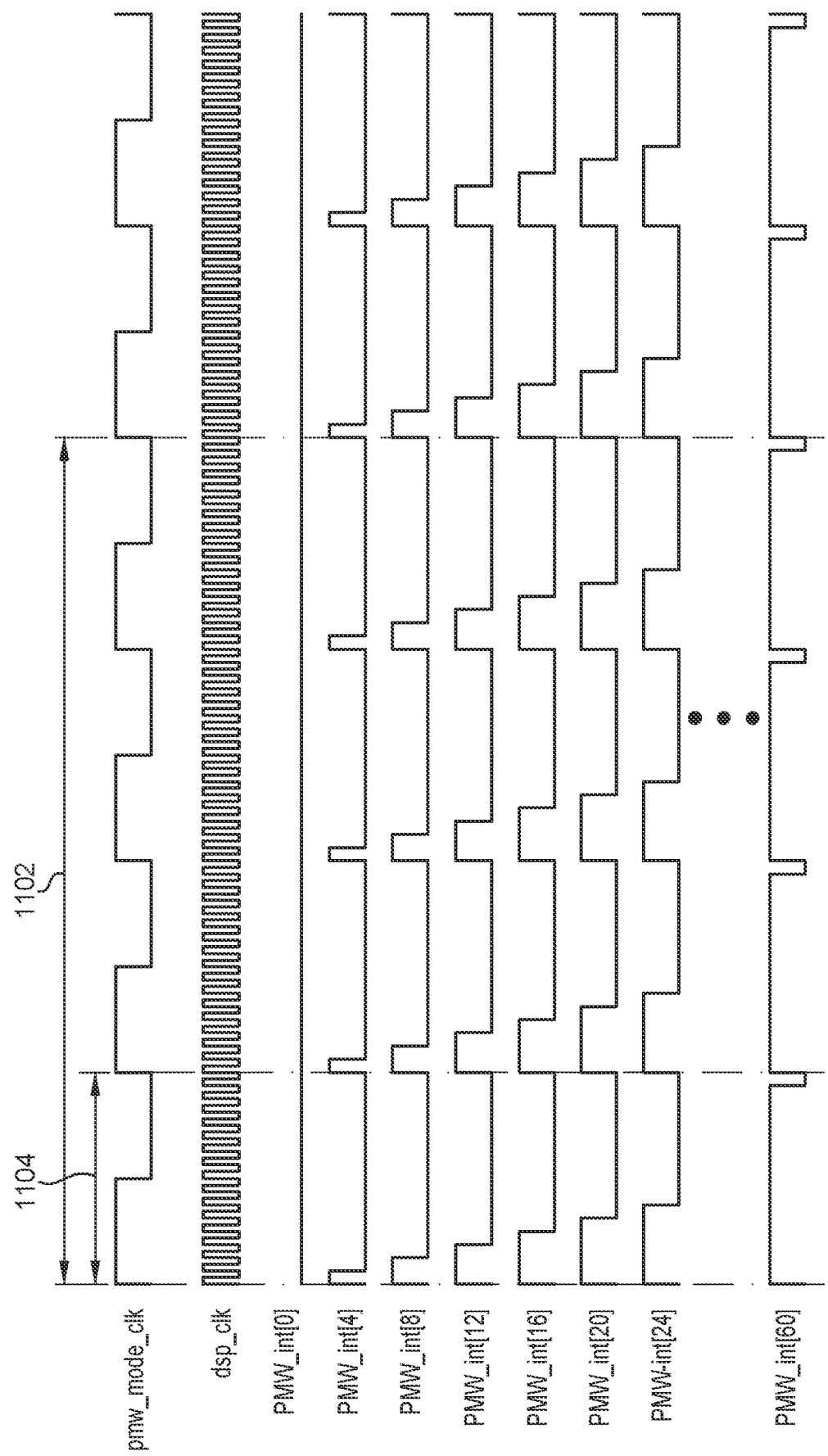

TEMPERATURE-LOCKED LOOP FOR OPTICAL ELEMENTS HAVING A TEMPERATURE-DEPENDENT RESPONSE

TECHNICAL FIELD

Examples of the present disclosure generally relate to a temperature-locked loop for optical elements having a temperature-dependent response.

BACKGROUND

Optical devices have been used for communications, such as over a fiber optic channel. Optical communications can implement low loss physical channels and high speeds. Like electrical devices, some optical devices can be used to process or filter signals, albeit optical signals. However, some optical devices can have features that are not present or not as significant in an electrical device. Further growth and implementation of optical devices in future technologies may require these features to be addressed.

SUMMARY

Examples described herein generally relate to devices and methods for a temperature-locked loop for optical elements having a temperature-dependent response. In some examples, settings tracking and temperature locking can be implemented for optical devices operating at a high speed.

An example described herein is a device. The device includes a controller and a digital-to-analog converter (DAC). The controller includes a DC-controllable transimpedance stage, a slicer circuit, and a processor. The DC-controllable transimpedance stage has an input node and an output node. The input node of the DC-controllable transimpedance stage is configured to be electrically coupled to a photodiode. The slicer circuit has an input node and an output node. The input node of the slicer circuit is electrically coupled to the output node of the DC-controllable transimpedance stage. The processor has an input node electrically coupled to the output node of the slicer circuit. The processor is configured to control the DC-controllable transimpedance stage to reduce a DC component of a signal on the output node of the DC-controllable transimpedance stage based on a signal on the output node of the slicer circuit. The DAC has an input node electrically coupled to an output node of the processor and has an output node configured to be electrically coupled to a heater. The processor is configured to control an output voltage on the output node of the DAC based on the signal on the output node of the slicer circuit.

Another example described herein is a method for controlling temperature of a device. A DC setting is generated by a processor, where the DC setting is output from the processor to a DC-controllable transimpedance stage. The DC-controllable transimpedance stage has an input node electrically coupled to a photodiode. The photodiode is configured to have incident thereon an optical signal passed from a optical element. The optical element has a temperature-dependent optical response. The processor generates the DC setting based on a signal on an output node of the DC-controllable transimpedance stage. After generating the DC setting, a temperature setting is generated by the processor. A code output from the processor to a DAC is based on the temperature setting. The DAC has an output node electrically coupled to a heater that is disposed proximate the optical element. The processor generates the temperature setting based on the signal on the output node of the DC-controllable transimpedance stage.

Another example described herein is a device. The device includes an optical element, a photodiode, a heater, a transimpedance stage, a slicer circuit, and a processor. The optical element is configured to pass an optical signal and has a temperature-dependent optical response. The photodiode is disposed relative to the optical element such that at least some of the optical signal through the optical element is incident on the photodiode. The heater is disposed proximate the optical element and is configured to convert electrical energy to thermal energy. An input node of the transimpedance stage is electrically coupled to the photodiode. The transimpedance stage includes a controllable current source electrically connected between the input node of the transimpedance stage and a power supply node. An input node of the slicer circuit is electrically coupled to an output node of the transimpedance stage. An input node of the processor is electrically coupled to an output node of the slicer circuit. The processor is configured to control a current of the controllable current source based on an output signal on the output node of the slicer circuit and is configured to control an amount of electrical energy provided to the heater based on the output signal on the output node of the slicer circuit.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIGS. 11A and 11B are timing diagrams illustrating signals generated in the PWM circuit in different modes according to some examples.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
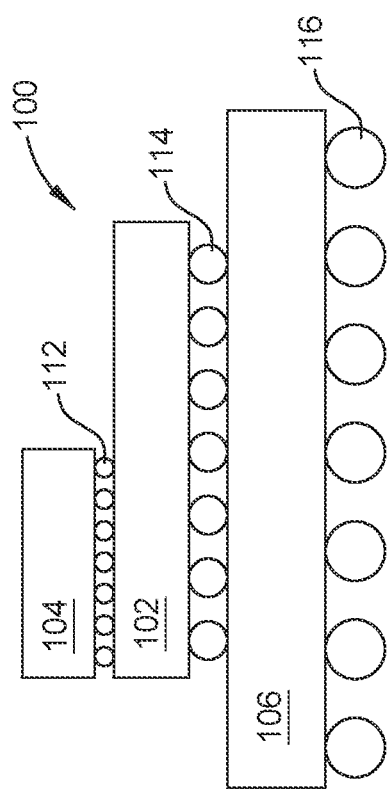
FIG. 1 is a package of a device according to some examples.

Examples described herein generally relate to devices and methods for a temperature-locked loop for optical elements having a temperature-dependent response. Generally, devices according to some examples include an electrical integrated circuit (IC) die (that includes an electrical IC) and an optical die (that includes an optoelectronic circuit). The optical die and optoelectronic circuit includes an optical element, a photodiode, and a heater. The optical element is configured to pass an optical signal, and the optical element has a temperature-dependent optical response. Example optical elements include a ring modulator, a double ring filter, a Mech-Zehnder interferometer (MZI), or the like. The photodiode is disposed relative to the optical element such that at least some of the optical signal passed through the optical element is incident on the photodiode. The heater is disposed proximate the optical element. The electrical IC die and the electrical IC includes a controller and a first digital-to-analog converter (DAC). The photodiode is electrically coupled to an input node of the controller. An output node of the controller is electrically coupled to an input node of the first DAC, and an output node of the first DAC is electrically coupled to the heater. Generally, the controller is configured to control a temperature of the heater, and thereby the optical element, such that the optical element may have a target optical response at a target wavelength of an optical signal. The controller can cause the first DAC to output a voltage that has a dithering duty cycle.

Further, the controller of the electrical IC can include a transimpedance stage, a slicer circuit, and a processor (e.g., a digital signal processor (DSP)). The transimpedance stage can include a transimpedance amplifier and a controllable current source with a second DAC. The processor is configured to iteratively track DC settings and temperature settings. The DC settings can include a code output to the second DAC that causes the second DAC to output a bias voltage to the controllable current source, and/or can include one or more selection signals that can cause a biased transistor within the controllable current source to be operably coupled or de-coupled. The controllable current source is configured to reduce and/or remove a DC component of a signal output by the transimpedance stage. The temperature settings can include a level selection value and a duty code, and a thermal code, in some examples, having a dithering duty cycle is generated based on the level selection value and the duty code and is output to the first DAC. The voltage output from the first DAC can control the heater to achieve a temperature in the optical die such that the optical element has, e.g., an optical response with a peak or trough that aligns with a target wavelength. The DC settings and temperature settings can be tracked based on signals sampled from the slicer circuit and based on respective signals output from the transimpedance stage. In some examples, tracking and locking can be implemented for optical devices operating at a high speed, such as equal to and greater than 53 Gb/s.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

In the description that follows, various signals, data, or codes are described in the context of the operation of various circuits. A described signal, data, or code indicates a corresponding node on which the signal, data, or code is applied or propagated and further indicates nodes that are communicatively coupled and/or electrically connected. For example, description of a signal, data, or code output from a first circuit and input to a second circuit indicates an output node of the first circuit (on which the signal, data, or code is output from the first circuit) is communicatively coupled and/or electrically connected to an input node of the second circuit (on which the signal, data, or code is input to the second circuit). Explicit description of such nodes may be omitted in the following description, but a person having ordinary skill in the art will readily understand the presence of the nodes. Additionally, a given node may have multiple bit positions, such as for a multi-bit data or multi-bit code.

FIG. 1 illustrates a package 100 of a device according to some examples. The package 100 includes an electrical integrated circuit (IC) die 102, an optical die 104, and a package substrate 106. The electrical IC die 102 includes various circuits configured to generate an electrical signal that is transmitted to the optical die 104 and includes a control circuit configured to control an optical response of the optical die 104. The optical die 104 is configured to generate an optical signal based on the received electrical signal and to transmit the optical signal, e.g., via an optical fiber.

The optical die 104 is mechanically attached and electrically coupled to the electrical IC die 102 (e.g., a backside of the electrical IC die 102) by external electrical connectors 112. The external electrical connectors 112 are minibumps in some examples. The electrical IC die 102 (e.g., a front side of the electrical IC die 102) is mechanically attached and electrically coupled to a first side of the package substrate 106 by external electrical connectors 114. The external electrical connectors 114 are controlled collapse chip connections (C4) in some examples. External electrical connectors 116 are on a second side of the package substrate 106 (e.g., opposite from the first side of the package substrate 106) and are mechanically attached and electrically coupled to the package substrate 106.

Figure 2:
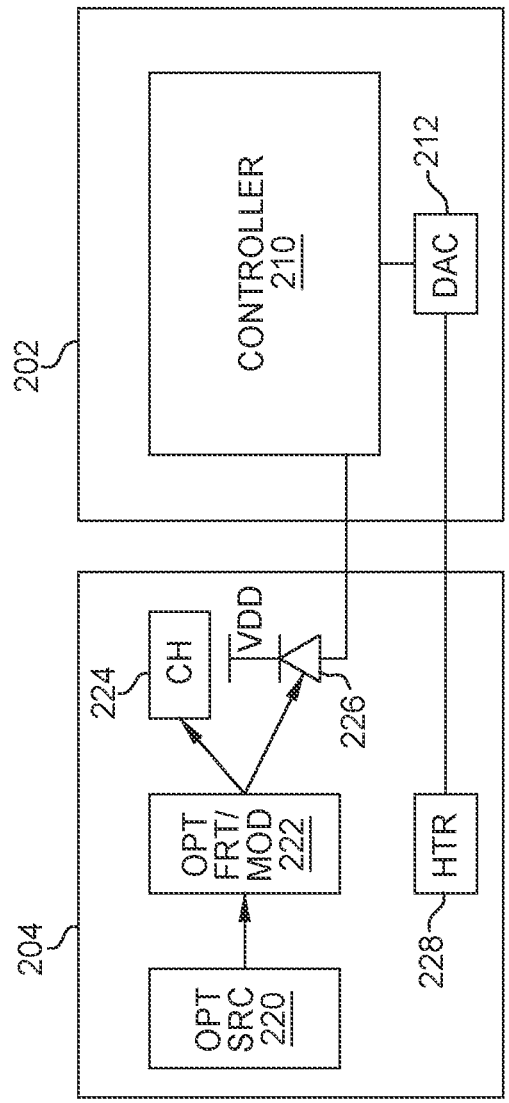
FIG. 2 is a simplified schematic of at least a portion of the device of FIG. 1 according to some examples.

FIG. 2 is a simplified schematic of at least a portion of the device of FIG. 1 according to some examples. In the illustrated example, the electrical IC die 102 includes an electrical IC 202, and the optical die 104 includes an optoelectronic circuit 204. The electrical IC 202 includes a controller 210 and a DAC 212. Although not illustrated, the electrical IC 202 further includes a circuit to generate an electrical signal that is to be transmitted as an optical signal over an optical channel. The optoelectronic circuit 204 includes an optical source 220, an optical element 222, an optical output channel 224, a photodiode 226, and a heater 228. The optical element 222 can be any optical element configured to pass an optical signal and having a temperature-dependent optical response, such as a ring modulator, a double ring filter, a Mech-Zehnder interferometer (MZI), or the like. In some examples, the heater 228 is a resistor; although any heater can be implemented.

Generally, a circuit of the electrical IC 202 generates an electrical signal that is communicated to the optoelectronic circuit 204. The optical source 220 generates an optical signal based on the received electrical signal, and transmits the optical signal to the optical element 222. The optical signal output from the optical element 222 is transmitted through the optical output channel 224. The photodiode 226 is disposed in the optical die 104 such that some portion of the optical signal output from the optical element 222 is incident on the photodiode 226. The photodiode 226 is configured to generate an electrical current (e.g., including by being electrically coupled to a power supply node, such as a VDD node) in response to the optical signal incident on the photodiode 226. The photodiode 226 is electrically coupled to the controller 210, and the controller 210 is configured to detect the electrical current generated by the photodiode 226. The controller 210, in response to the detected electrical current, outputs a digital value to the DAC 212. The DAC 212 is configured to convert the digital value to an analog voltage and/or current. The heater 228 is electrically coupled to the DAC 212 and is disposed in the optical die 104 proximate to the optical element 222. The DAC 212 is configured to output the analog voltage and/or current to the heater 228. In response to the received analog voltage and/or current, the heater 228 can control a temperature of the optical element 222.

Figure 3A:
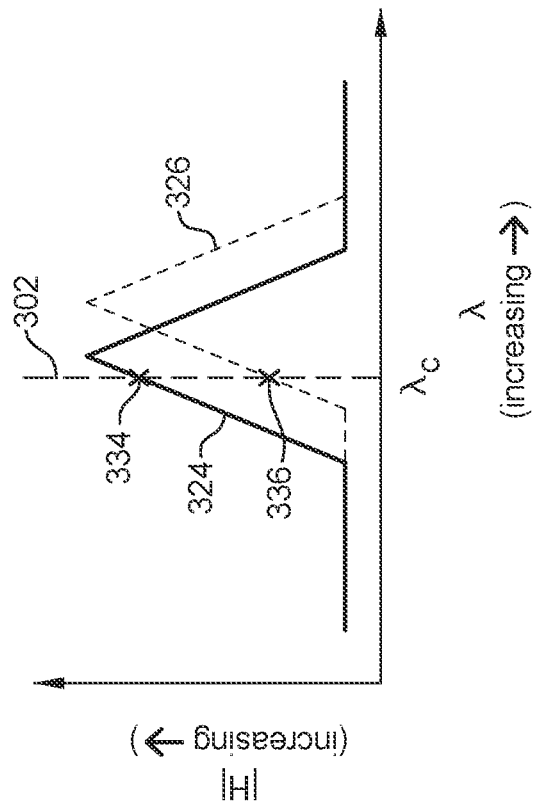
FIGS. 3A and 3B are charts illustrating effects when a center wavelength of an optical signal is on a right hand side (RHS) and a left hand side (LHS), respectively, of a peak of a magnitude of an optical response according to some examples.
Figure 3B:
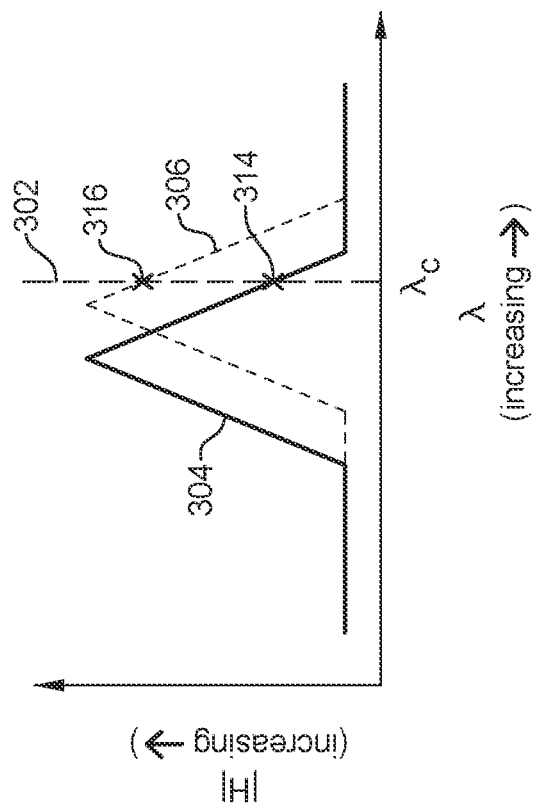

In some examples, the optical element 222 has an optical response that can vary based on a temperature of the optical element 222. FIGS. 3A and 3B are charts illustrating effects of temperature on the optical response of the optical element 222 according to some examples. The charts of FIGS. 3A and 3B have wavelength (λ) along an x-axis and have a magnitude of an optical response (|H|) (e.g., as a function of wavelength) of the optical element 222 along a y-axis. FIGS. 3A and 3B show a center wavelength (λc) 302 of an optical signal to be output by the optical element 222. FIG. 3A shows effects when the center wavelength (λc) 302 is on a right hand side (RHS) of a peak of the magnitude of the optical response, and FIG. 3B shows effects when the center wavelength (λc) 302 is on a left hand side (LHS) of a peak of the magnitude of the optical response.

FIG. 3A shows a first response 304 when the optical element 222 is at a first temperature, and shows a second response 306 when the optical element 222 is at a second temperature. The first temperature is less than the second temperature. In this RHS scenario, the first response 304 has a magnitude 314 at the center wavelength (λc) 302 that is less than a magnitude 316 of the second response 306 at the center wavelength (λc) 302. Increasing the temperature of the optical element 222 from the first temperature to the second temperature results in an increased magnitude at the center wavelength (λc) 302, which brings the center wavelength (λc) 302 closer to the peak for the second response 306. Conversely, decreasing the temperature of the optical element 222 from the second temperature to the first temperature can result in a decreased magnitude at the center wavelength (λc) 302, which brings the center wavelength (λc) 302 further from the peak for the first response 304.

FIG. 3B shows a first response 324 when the optical element 222 is at a first temperature, and shows a second response 326 when the optical element 222 is at a second temperature. The first temperature is less than the second temperature. In this LHS scenario, the first response 324 has a magnitude 334 at the center wavelength (λc) 302 that is greater than a magnitude 336 of the second response 326 at the center wavelength (λc) 302. Increasing the temperature of the optical element 222 from the first temperature to the second temperature results in a decreased magnitude at the center wavelength (λc) 302, which brings the center wavelength (λc) 302 further from the peak for the second response 326. Conversely, decreasing the temperature of the optical element 222 from the second temperature to the first temperature can result in an increased magnitude at the center wavelength (λc) 302, which brings the center wavelength (λc) 302 closer to the peak for the first response 324.

Generally, examples described herein can control, by a temperature-locked loop, a temperature of the optical element 222 to control an optical response of the optical element 222. The heater 228 is configured to generate thermal energy generally localized proximate to the optical element 222, and the heater 228 is controlled by the controller 210. The controller 210 can, in response to the optical signal detected by the photodiode 226, control the heater 228 to provide thermal energy to increase and/or decrease the temperature of the optical element 222 to bring, e.g., a peak or a trough of the magnitude of the optical response of the optical element 222 close to the center wavelength of the optical signal.

In some examples, the heater 228 may not actively reduce a temperature of the optical element 222. Rather, thermal energy may dissipate from the package 100, such as by employing a heat spreader, which, when coupled with a reduced amount of thermal energy provided by the heater 228, may result in a decrease in temperature (e.g., a collective decrease in thermal energy) of the optical element 222. In such situations, a temperature can be increased by the heater 228 providing thermal energy at a greater rate than thermal energy is dissipated, and a temperature can be decreased by the heater providing thermal energy (if any) at a lesser rate than thermal energy is dissipated.

Figure 4:
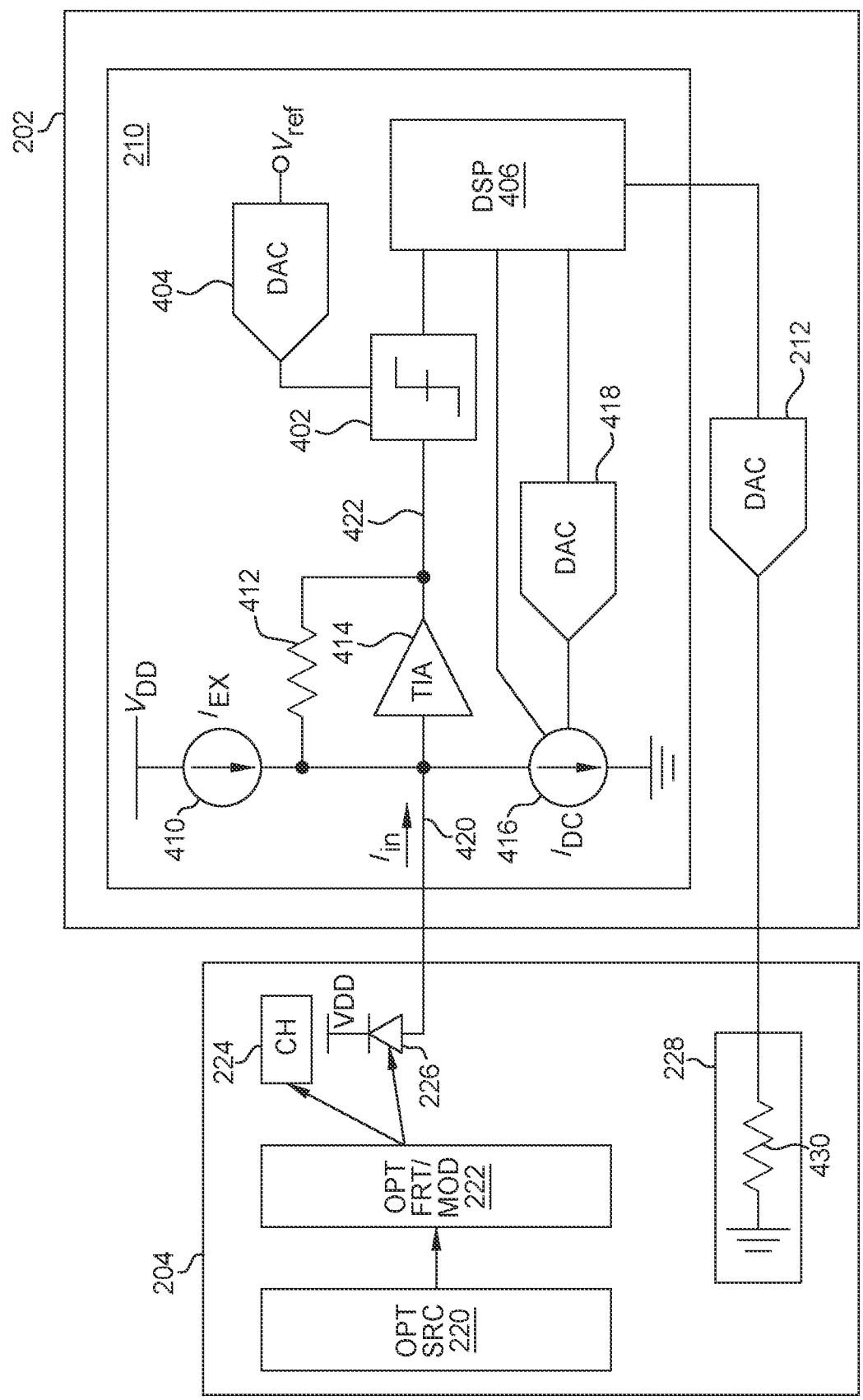
FIG. 4 is a more detailed schematic of the simplified schematic of FIG. 2 according to some examples.

FIG. 4 is a more detailed schematic of the simplified schematic of FIG. 2 according to some examples. The controller 210 includes a DC-controllable transimpedance stage, a slicer circuit 402, a DAC 404, and a DSP 406. The DC-controllable transimpedance stage includes a current source 410, a resistor 412, a transimpedance amplifier (TIA) 414, a controllable current source 416, and a DAC 418.

A cathode of the photodiode 226 is electrically connected to a first power supply node (e.g., a VDD node), and an anode of the photodiode 226 is electrically coupled to an input node 420 of the DC-controllable transimpedance stage, which can further be an input node of the controller 210. The current source 410 is electrically connected between the first power supply node (e.g., the VDD node) and the input node 420. The current source 410 can be or include a current mirror biased by a static current such that the current source 410 is configured to provide a static or constant current. The controllable current source 416 is electrically connected between the input node 420 and a second power supply node (e.g., a ground node). A first terminal of the resistor 412 is electrically connected to the input node 420, and a second terminal of the resistor 412 (opposite from the first terminal) is electrically connected to an output node 422 of the DC-controllable transimpedance stage. An input node of the TIA 414 is electrically connected to the input node 420, and an output node of the TIA 414 is electrically connected to the output node 422.

A signal input node of the slicer circuit 402 is electrically connected to the output node 422 of the DC-controllable transimpedance stage. A reference voltage input node of the slicer circuit 402 is electrically connected to an output node of the DAC 404. An output node of the slicer circuit 402 is electrically connected to an input node of the DSP 406. In some examples, the slicer circuit 402 can be or include a comparator. An input node of the DAC 404 can be electrically coupled to, e.g., a memory element (such as electrical fuses (eFuses)) that stores a digital value corresponding to a reference voltage ($V_{ref}$). The reference voltage $V_{ref}$ can be, in some examples, $V_{DD}/2$.

The DSP 406 has one or more control output nodes electrically connected to respective one or more control input nodes of the DC-controllable transimpedance stage, including the controllable current source 416 and the DAC 418. The DSP 406 has a control output node electrically connected to a control input node of the controllable current source 416. The DSP 406 has another control output node electrically connected to an input node of the DAC 418. An output node of the DAC 418 is electrically connected to a bias voltage node of the controllable current source 416. In the illustrated example, the controllable current source 416 has two mechanisms by which the controllable current source 416 can be controlled, which will be detailed subsequently. In other examples, one and/or different mechanisms can be implemented to control the controllable current source 416.

The DSP 406 has another output node electrically connected to an input node of the DAC 212. The DSP 406 can include or be any combination of combinational logic, sequential logic, state machines, and any other circuits. The DSP 406 is generally configured to implement functions described herein and may further implement each of the functions by hardware alone, by hardware executing machine-executable instructions, or a combination thereof (e.g., a portion of the function being implemented by hardware alone while another portion of the function is implemented by hardware executing machine-executable instructions).

An output node of the DAC 212 is electrically coupled to an input node of the heater 228. In the illustrated example, the heater 228 includes or is a resistor 430. The resistor 430 is electrically connected between the input node of the heater 228 and a power supply node (e.g., a ground node) in the illustrated example.

In operation, the photodiode 226 generates an electrical current in response to the optical signal incident on the photodiode 226. The electrical current generated by the photodiode 226 is received by the controller 210 at the input node 420 as an input current $I_{in}$. The DC-controllable transimpedance stage generates a voltage signal at the output node 422 of the DC-controllable transimpedance stage based on the input current $I_{in}$ at the input node 420. The slicer circuit 402 generates a logical "1" or a logical "0" based on whether the voltage signal at the output node 422 is greater than a reference voltage output by the DAC 404. The DAC 404 generates the reference voltage based on, e.g., the digital value stored in the memory element communicatively coupled to the input node of the DAC 404. The reference voltage can be a static voltage, and hence, in some examples, the digital value stored in the memory element can be static. The DSP 406 samples the logical "1"s and logical "0"s generated by the slicer circuit 402.

Figure 5:
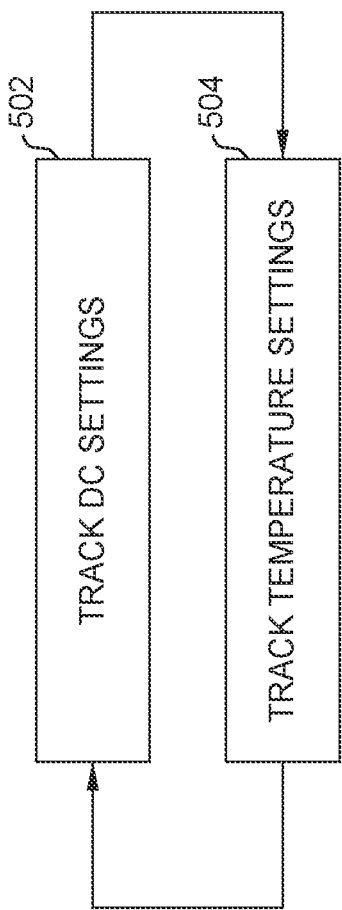
FIG. 5 is a flowchart of a method for a temperature-locked loop according to some examples.

The DSP 406, as shown in FIG. 5, iteratively tracks DC settings at block 502 and tracks temperature settings at block 504. When tracking DC settings at block 502, the DSP 406 sets DC settings for the controllable current source 416 and DAC 418 to provide a current $I_{DC}$ that diverts a DC component of the input current $I_{in}$ at the input node 420 to the second power supply node (e.g., the ground node). This can result in a DC component of the voltage signal at the output node 422 being reduced and/or removed. Reducing and/or removing this DC component of the voltage signal can cause the slicer circuit 402 and DSP 406 to more accurately capture logical "1"s and logical "0"s relative to the optical signal that was incident on the photodiode 226.

Generally, and as described in more detail subsequently, the DSP 406 responsively increases or decreases the current $I_{DC}$ of the controllable current source 416 based on the number of logical "1"s and the number of logical "0"s that are captured from the slicer circuit 402. A voltage output from the DAC 212 to the heater 228 dithers between different duty cycles during a time period in which samples from the slicer circuit 402 are captured for DC settings tracking at block 502. Generally, it is assumed that for a statistically significant sample size, the optical signal incident on the photodiode 226 has an equal number of logical "1"s and logical "0"s. Therefore, with the voltage output from the DAC 212 dithering between different duty cycles, if the number of captured logical "1"s is, e.g., significantly greater than the number of captured logical "0"s, a DC component may be in the voltage signal at the output node 422, and the DSP 406 responsively adjusts the current $I_{DC}$ of the controllable current source 416 to reduce and/or remove the DC component of the voltage signal at the output node 422. Conversely, if the number of captured logical "0"s is, e.g., significantly greater than the number of captured logical "1"s, the current $I_{DC}$ of the controllable current source 416 may incorrectly divert a portion of an AC component of the input current $I_{in}$ at the input node 420, and the DSP 406 responsively adjusts the current $I_{DC}$ of the controllable current source 416 to restore the diverted AC component of the voltage signal at the output node 422.

When tracking temperature settings at block 504, the DSP 406 sets a code provided to the DAC 212, which in turn provides a voltage and/or current to the heater 228 (e.g., the resistor 430). Depending on the voltage and/or current and the rate at which thermal energy is dissipated from the package 100, the temperature of the optical element 222 can be maintained, can be increased, or can be decreased, which can adjust the optical response of the optical element 222. The code has a duty cycle that dithers. For example, the code can have one duty cycle while a clock signal is logically low and another, different duty cycle while the clock signal is logically high. As described in more detail subsequently, the DSP 406 responsively increases or decreases a level of the code and/or a duty cycle of the code provided to the DAC 212 based on the number of logical "1"s and the number of logical "0"s that are sampled at a given time in a respective cycle of the clock signal. Generally, the number of logical "1"s and logical "0"s that are captured indicates whether the center wavelength of the optical signal is on the RHS or LHS of the optical response of the optical element 222, in part due to the DC settings. The DSP 406 causes the level and/or duty cycle of the code provided to the DAC 212 to be adjusted based on the number of captured logical "1"s and logical "0"s so that a temperature of the optical element 222 is responsively adjusted.

Since, for example, the package 100 can be disposed in an environment where the ambient temperature can vary, the DSP 406 can iteratively track DC settings and track temperature settings to adjust an amount of electrical energy provided to the heater 228 that the heater converts to thermal energy. In each iteration, the DC settings can be reset to some predetermined initial amount so that the amount of the current $I_{DC}$ of the controllable current source 416 can be determined anew each iteration. The temperature settings can be adjusted from one iteration to another iteration. The temperature setting, in some examples, are not reset each iteration.

The following figures and description provide for a more detailed example that is programmable in some aspects. Other examples may not be programmable, or may be programmable in fewer, more, or different aspects. A person having ordinary skill in the art will readily understand modifications to change the following example to omit or include various programmability.

Figure 6:
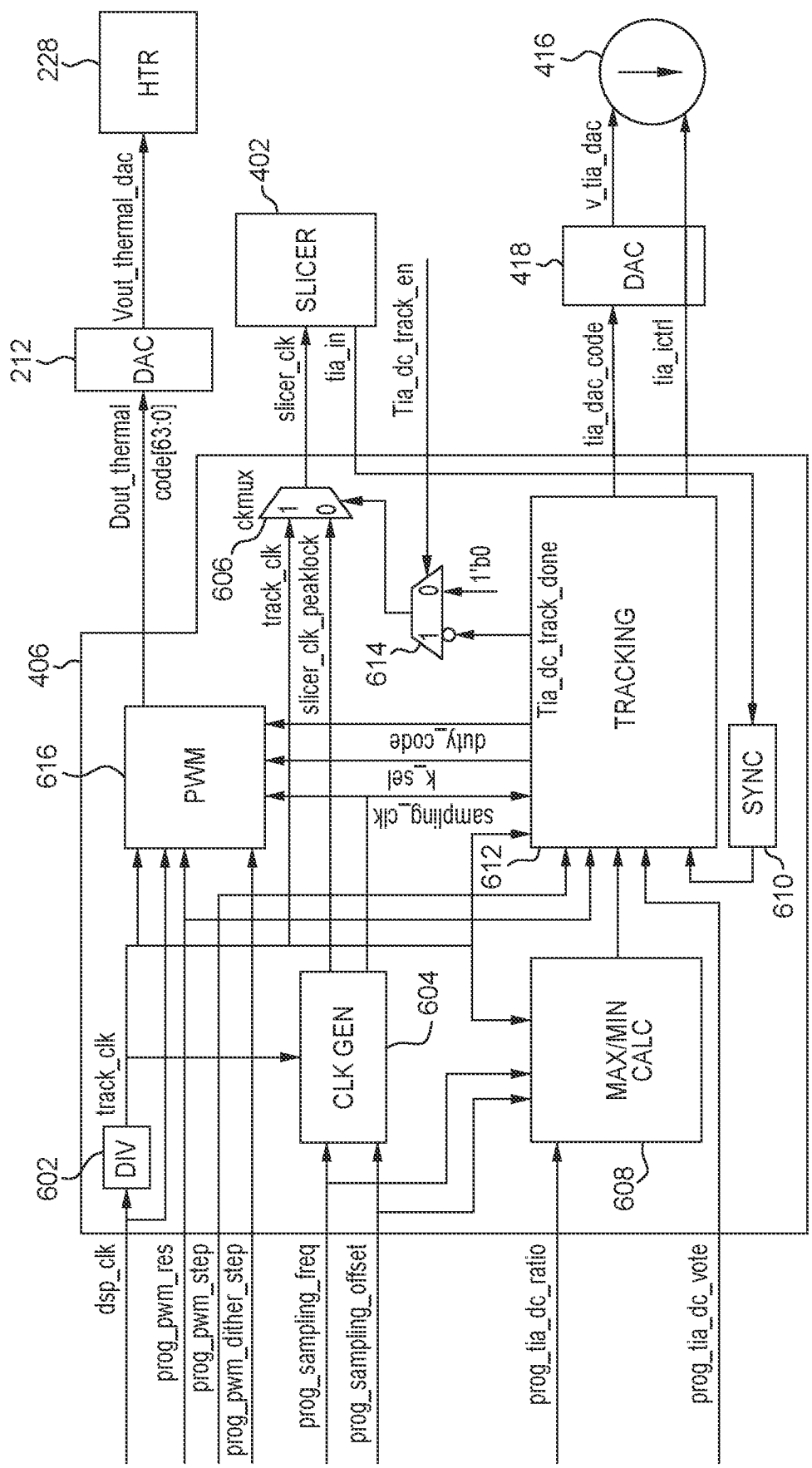
FIG. 6 depicts a schematic of a digital signal processor (DSP) of FIG. 4 according to some examples.

FIG. 6 depicts a schematic of the DSP 406 according to some examples. The DSP 406 includes a clock frequency divider circuit 602, a clock generation circuit 604, multiplexers 606, 614, a max/min calculation circuit 608, a synchronizing circuit 610, a tracking circuit 612, and a pulse width modulation (PWM) circuit 616. FIG. 6 further illustrates the DACs 212, 418, heater 228, slicer circuit 402, and controllable current source 416 to facilitate explanation of various signals.

Figure 7:
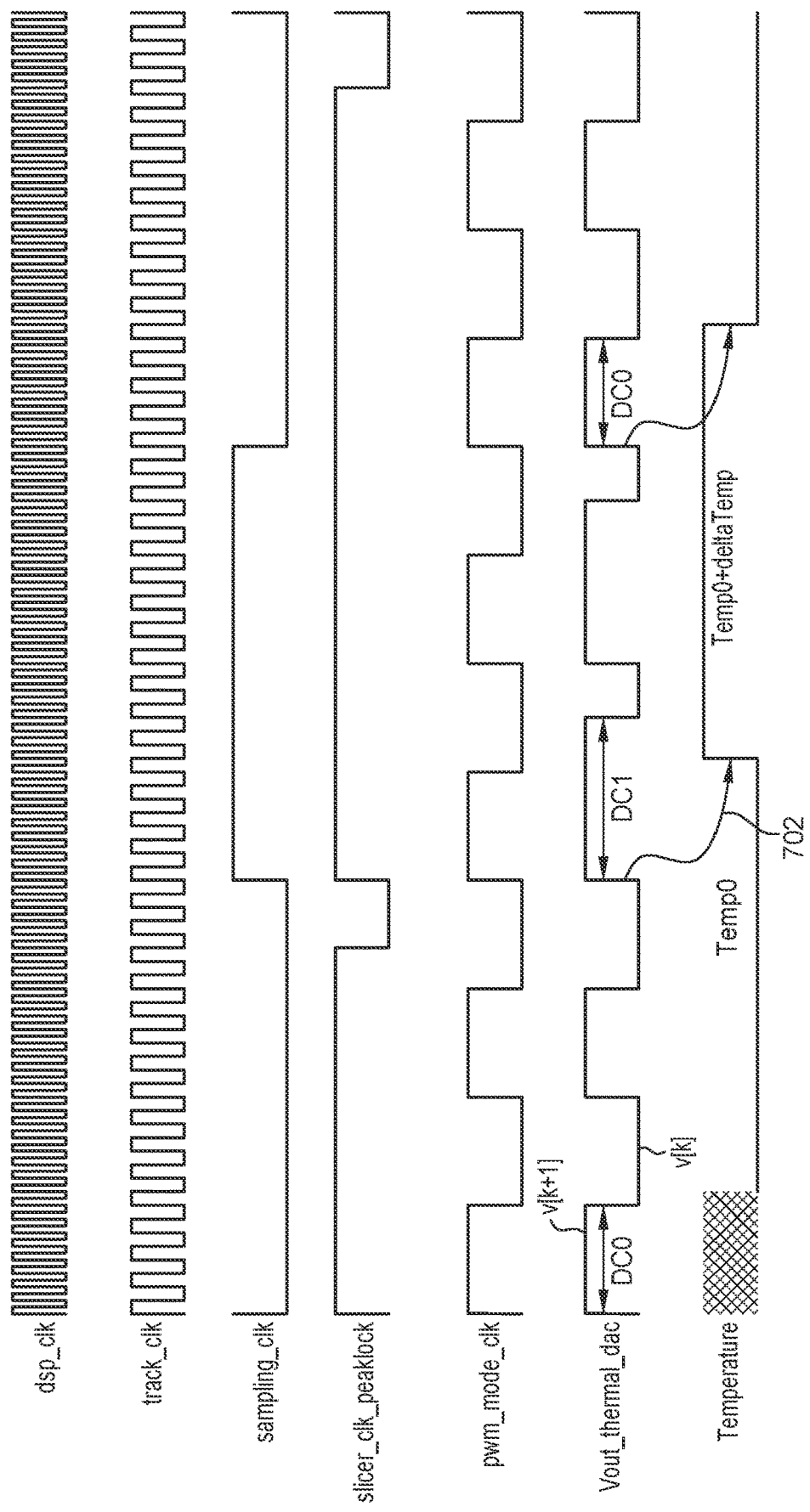
FIG. 7 is a timing diagram of various signals of the DSP, a voltage output from a digital-to-analog converter (DAC) of FIG. 4, and a temperature of a heater of FIG. 4 according to some examples.

Before explaining in detail FIG. 6, various signals identified in FIG. 6 are described generally with respect to the timing chart of FIG. 7. This general description will help contextualize operations and functionality described in detail subsequently. A DSP clock signal (dsp_clk) is generally the clock signal on which operation of the DSP 406 is based. A tracking clock signal (track_clk) is a frequency divided clock signal based on the dsp_clk. In examples described herein, the track_clk has a frequency that is half of the frequency of the dsp_clk, although the frequency of the track_clk can be other divided amounts of the frequency of the dsp_clk. In an example, the frequency of dsp_clk is 875 MHz, and the frequency of track_clk is 437.5 MHz.

A sampling clock signal (sampling_clk) and a peak lock signal (slicer_clk_peaklock) have a same frequency and are phase aligned. The sampling_clk, in part, controls when the DSP 406 is in the DC settings tracking phase of block 502 and in the temperature settings tracking phase at block 504. The sampling_clk can be programmable. Generally, the sampling_clk has a frequency that is orders of magnitude less than the frequency of dsp_clk. For example, the frequency of the sampling_clk can be from on the order of tens of kilohertz to on the order of tens of megahertz. The slicer_clk_peaklock is generally at a logical "1" level except for a small time in each cycle where a decision by the DSP 406 is made to increase or decrease temperature settings, which resets the slicer circuit 402.

A PWM mode clock signal (pwm_mode_clk) is shown in FIG. 7, which may not be explicit in the DSP 406. The pwm_mode_clk indicates the frequency at which signals are output from the PWM circuit 616. The pwm_mode_clk is a frequency divided clock signal based on the dsp_clk. The pwm_mode_clk, in examples described below, has a programmable frequency. The frequency of the pwm_mode_clk can be any divided amount of the frequency of the dsp_clk, whether programmable or non-programmable. In an example, the pwm_mode_clk is programmable between two modes, one of which controls the pwm_mode_clk to have a frequency that is one-sixteenth of the frequency of the dsp_clk, and the other of which controls the pwm_mode_clk to have a frequency that is one-sixty-fourth of the frequency of the dsp_clk.

An analog output voltage (Vout_thermal_dac) is output from the DAC 212 to the heater 228. The Vout_thermal_dac is based on signals output from the DSP 406 and has a same frequency as the pwm_mode_clk. The Vout_thermal_dac oscillates between a k-level voltage (v[k]) and a (k+1)-level voltage (v[k+1]). The duty cycle of Vout_thermal_dac is dithered based on the sampling_clk. When the sampling_clk is logically low, the Vout_thermal_dac has a duty cycle DC0, and when the sampling_clk is logically high, the Vout_thermal_dac has a duty cycle DC1. Duty cycle DC1 is greater than duty cycle DC0.

Vout_thermal_dac having the duty cycle DC0 causes the temperature at the heater 228 to be a temperature Temp0. Vout_thermal_dac having the duty cycle DC1 causes the temperature at the heater 228 to be a temperature Temp0+deltaTemp. Delay 702 from the change from duty cycle DC0 to duty cycle DC1 can occur before the temperature responsively changes.

The temperature at the heater 228 can be a complex function of the rate at which electrical energy is converted to thermal energy by the heater 228 and the rate at which thermal energy dissipates from the package 100. When the Vout_thermal_dac is greater (e.g., for the voltage v[k+1] relative to the voltage v[k]), greater thermal energy is converted at the heater 228. Hence, a greater duty cycle of Vout_thermal_dac allows more thermal energy to be converted at the heater 228 compared to a lesser duty cycle of Vout_thermal_dac (assuming Vout_thermal_dac dithers between the same voltages for the duty cycles). This can cause more thermal energy to accrue at the heater 228, which can cause an increased temperature. The increase in temperature can be a logarithmic response, although FIG. 7 shows a step increase or decrease for illustration purposes. In some examples, the delay 702 between the time at which the duty cycle of Vout_thermal_dac is increased to the time at which the temperature at the heater 228 reaches the temperature Temp0+deltaTemp is on the order of 6 µs. Multiple cycles of dithering Vout_thermal_dac may occur between the time at which the duty cycle is increased and the time at which the temperature at the heater 228 reaches the temperature Temp0+deltaTemp.

The temperature at the heater 228 can be controlled by selecting which k-level voltage v[k] and (k+1)-level voltage v[k+1] is to be dithered and by selecting the duty cycle of dithering the Vout_thermal_dac. Selecting a value for k determines the voltage levels between which the Vout_thermal_dac dithers. Selecting these voltage levels can determine a possible range of temperatures (e.g., from temperature Temp[k] to temperature Temp[k+1]) that can be achieved at the heater 228.

Selecting the duty cycle of the Vout_thermal_dac for dithering can achieve a temperature at the heater 228 that is in the range from temperature Temp[k] to temperature Temp[k+1]. The duty cycle can achieve interpolation of the temperature at the heater 228 within the range from temperature Temp[k] to temperature Temp[k+1] due to the accrual (e.g., integration) of thermal energy converted by the heater 228. Lower duty cycles can cause the temperature at the heater 228 to approach the temperature Temp[k], whereas higher duty cycles can cause the temperature at the heater 228 to approach the temperature Temp[k+1].

Referring back to FIG. 6, the clock frequency divider circuit 602 is configured to divide the frequency of an input clock signal by some amount, which, in an example, is two. The clock frequency divider circuit 602 can include a clocked D flip-flop configured to divide the frequency by two. The dsp_clk is input on an input node of the clock frequency divider circuit 602, and the track_clk is output on an output node of the clock frequency divider circuit 602.

The clock generation circuit 604 is configured to generate the sampling_clk and the slicer_clk_peaklock based on the track_clk, a programmable sampling frequency value (prog_sampling_freq), and a programmable sampling offset value (prog_sampling_offset). The clock generation circuit 604 can include any appropriate logic or other circuit to generate the sampling_clk and the slicer_clk_peaklock. The prog_sampling_freq can select a primary frequency for the sampling_clk, and the available primary frequencies can be determined by the architecture and circuit implemented by the clock generation circuit 604. The prog_sampling_offset can select a number of additional cycles of the track_clk to include within one cycle for the sampling_clk, and the available number of additional cycles can be determined by the architecture and circuit implemented by the clock generation circuit 604. As an example, assuming that 32,768 cycles of track_clk occur for each cycle of the selected primary frequency indicated by prog_sampling_freq and that the additional number of cycles indicated by prog_sampling_offset is 128, the sampling_clk would therefore have a frequency that achieves 32,896 (e.g., 32,768+128) cycles of the track_clk per cycle of the sampling_clk. The frequency of the sampling_clk can be mathematically noted as shown below:

$$f_{sampling\_clk} = \frac{f(\text{prog\_sampling\_freq})}{1 + \left[\frac{f(\text{prog\_sampling\_freq})}{f_{track\_clk}} \times C(\text{prog\_sampling\_offset})\right]}$$

where $f_{sampling\_clk}$ and $f_{track\_clk}$ are the respective frequencies of the sampling_clk and track_clk, f(prog_sampling_freq) is the primary frequency indicated by prog_sampling_freq, and C(prog_sampling_freq) is the additional number of cycles indicated by prog_sampling_offset. Table 1 below lists example values for $f_{track\_clk}$, prog_sampling_freq, f(prog_sampling_freq), prog_sampling_offset, C(prog_sampling_freq), and $f_{sampling\_clk}$ in an example.

TABLE 1

| $f_{track\_clk}$ | prog_sampling_freq[1:0] | f(prog_sampling_freq) | prog_sampling_offset[3:0]) | C(prog_sampling_offset[3:0] | $f_{sampling\_clk}$ |
|---|---|---|---|---|---|
| 437.5 MHz | 00 | 13.28 KHz (437.5 MHz/ 32768) | 0000 | 0 | 13.35 KHz |
| | | | 0001 | 64 | 13.33 KHz |
| | | | ... | 128 | 13.30 KHz |
| | | | 1110 | ... | ... |
| | | | 1111 | 960 | 12.97 KHz |
| | 01 | 106.25 KHz (437.5 MHz/ 4096) | 0000 | 0 | 106.81 KHz |
| | | | 0001 | 64 | 105.17 KHz |
| | | | ... | 128 | 103.58 KHz |
| | | | 1110 | ... | ... |
| | | | 1111 | 960 | 86.53 KHz |
| | 10 | 850 KHz (437.5 MHz/ 512) | 0000 | 0 | 854.49 KHz |
| | | | 0001 | 64 | 759.55 KHz |
| | | | ... | 128 | 683.59 KHz |

TABLE 1-continued

| $f_{track\_clk}$ | prog_sampling_freq[1:0] | f(prog_sampling_freq) | prog_sampling_offset[3:0]) | C(prog_sampling_offset[3:0] | $f_{sampling\_clk}$ |
|---|---|---|---|---|---|
| | | | 1110 | ... | ... |
| | | | 1111 | 960 | 297.21 KHz |
| | 11 | 6.8 MHz (437.5 MHz/ 64) | 0000 | 0 | 6.84 MHz |
| | | | 0001 | 64 | 3.42 MHz |
| | | | ... | 128 | 2.28 MHz |
| | | | 1110 | ... | ... |
| | | | 1111 | 960 | 427.25 KHz |

The clock generation circuit 604 further generates the slicer_clk_peaklock based on the sampling_clk. The slicer_clk_peaklock is generally at a logic level that enables the slicer circuit 402 except for a relatively small amount of time during each cycle of the sampling_clk where the slicer_clk_peaklock is at a logic level that resets the slicer circuit 402, as described above. The time at which the slicer_clk_peaklock is at a logic level that resets the slicer circuit 402 permits the DSP 406 to determine, and possibly adjust, a code output to the DAC 212 during the temperature settings tracking phase at block 504.

The multiplexer 606 is configured to receive the track_clk at a "1"-selection input node and the slicer_clk_peaklock at a "0"-selection input node. The multiplexer 606 is configured to selectively output the track_clk and the slicer_clk_peaklock as a slicer clock signal (slicer_clk) based on a control signal input from the multiplexer 614, which will be described subsequently. Generally, when DC settings tracking is enabled, the slicer_clk is the track_clk during the DC settings tracking phase of block 502, and the slicer_clk is the slicer_clk_peaklock during temperature settings tracking phase of block 504. When DC settings tracking is disabled, the slicer_clk is the track_clk.

The max/min calculation circuit 608 is configured to calculate a maximum and/or minimum number of logical "1"s and/or "0"s that is/are targeted for capture during a cycle of the sampling_clk. Since the signal captured from the slicer circuit 402 is a complementary signal, determining a maximum number of logical "1"s can also indicate a minimum number of logical "0"s, and vice versa. Accordingly, various logic can be implemented using any or a combination of the maximum and/or minimum number of logical "1"s and/or "0"s. In the example described herein, the max/min calculation circuit 608 is configured to calculate a maximum and minimum numbers of logical "1"s. The max/min calculation circuit 608 can include any appropriate logic or other circuit to calculate the maximum and/or minimum.

The max/min calculation circuit 608, in the illustrated example, is configured to calculate the maximum number of logical "1"s ($MAX_1$) and minimum number of logical "1"s ($MIN_1$) based on a programmable TIA DC error ratio value (prog_tia_dc_ratio), the prog_sampling_freq, the prog_sampling_offset, and the track_clk. The prog_tia_dc_ratio indicates a percentage of error samples that a number of samples captured from the slicer circuit 402 within one cycle of the sampling_clk may contain. For example, if 1% of a number of samples captured can be erroneous and the number of samples is 32,896 (e.g., the number of cycles of track_clk per one cycle of the sampling_clk in an example above), the number of error samples can be 329 of the 32,896.

For DC settings tracking, a number of samples are captured from the slicer circuit 402 based on the track_clk during an individual cycle of the sampling_clk. During a cycle of the sampling_clk, the Vout_thermal_dac has different duty cycles for different portions of the sampling_clk, as described above with respect to FIG. 7. After the delay 702, for one cycle of the sampling_clk, therefore, the temperature at the heater 228 will be dithering such that the response of the optical element 222 is likewise dithering. If under these conditions, a DC component of the input current $I_{in}$ is present and substantially unremoved, the samples captured from the slicer circuit 402 based on the track_clk can have a significantly greater number of logical "1"s compared to the number of logical "0"s, or vice versa. Ideally (although likely not practically), a DC component of the input current $I_{in}$ is removed, and the number of logical "1"s is equal to the number of logical "0"s. For a statistically significant sample size, it is assumed that the number of logical "1"s of the optical signal incident on the photodiode 226 is equal to the number of logical "0"s such that the number of logical "1"s within the samples captured from the slicer circuit 402 should be equal to the number of logical "0"s. Hence, any deviation from the captured number of logical "1"s being equal to the captured number of logical "0"s is assumed to be error. Hence, the $MAX_1$ is calculated to be half of the number of cycles of the track_clk per one cycle of the sampling_clk times the sum of one and half of the percentage indicated by prog_tia_dc_ratio, and the $MIN_1$ is calculated to be half of the number of cycles of the track_clk per one cycle of the sampling_clk times the sum of one and a negative half of the percentage indicated by prog_tia_dc_ratio. The number of cycles of the track_clk per one cycle of the sampling_clk, as indicated above, can be calculated as the sum of number of cycles of the track_clk per one cycle of the primary frequency indicated by prog_sampling_frequency and the additional number of cycles indicated by prog_sampling_offset. The $MAX_1$ can be mathematically noted as shown below:

$$MAX_1 = \left( \frac{\frac{f_{track\_clk}}{f(prog\_sampling\_freq)} + C(prog\_sampling\_offset)}{2} \right) \left( 1 + \frac{E(prog\_tia\_dc\_ratio)}{2} \right)$$

where $f_{track\_clk}$, f(prog_sampling_freq), C(prog_sampling_offset) are as noted above, and E(prog_tia_dc_ratio) is the percentage (divided by 100) indicated by prog_tia_dc_ratio. If $MAX_1$ is a non-integer, $MAX_1$ is rounded down to the nearest integer. The $MIN_1$ can be mathematically noted as shown below:

$$MIN_1 = \left( \frac{\frac{f_{track\_clk}}{f(prog\_sampling\_freq)} + C(prog\_sampling\_offset)}{2} \right) \left( 1 - \frac{E(prog\_tia\_dc\_ratio)}{2} \right)$$

If $MIN_1$ is a non-integer, $MIN_1$ is rounded up to the nearest integer.

Table 2 below list example values for prog_tia_dc_ratio, E(prog_tia_dc_ratio), and the resulting $MIN_1$ and $MAX_1$, assuming that prog_sampling_freq[1:0]=00 and prog_sampling_offset[3:0]=0000 as indicated in Table 1.

TABLE 2

| prog_tia_dc_ratio[2:0] | E(prog_tia_dc_ratio) | $MIN_1$ | $MAX_1$ |
|---|---|---|---|
| 000 | 0.02 | 16,415 | 16,417 |
| 001 | 0.2 | 16,400 | 16,432 |
| 010 | 1 | 16,334 | 16,498 |
| 011 | 5 | 16,006 | 16,826 |
| 100 | 10 | 15,596 | 17,236 |
| 101 | 20 | 14,775 | 18,057 |
| 110 | 50 | 12,312 | 20,520 |
| 111 | 90 | 9,029 | 23,803 |

Before turning to, among others, the tracking circuit 612, signals output from the tracking circuit 612 to the DAC 418 and controllable current source 416 are described. A transimpedance stage DAC digital code (tia_dac_code) is a multi-bit value (e.g., an eight bit value) output from the tracking circuit 612 to the DAC 418. The DAC 418 converts the multi-bit value of the tia_dac_code to an analog bias voltage (v_tia_dac) that is output to the controllable current source 416. A transimpedance stage current selection digital code (tia_ictrl) is a multi-bit code (e.g., an eight bit code) output from the tracking circuit 612 to the controllable current source 416.

Generally, the controllable current source 416 includes multiple serially connected pairs of transistors (e.g., channels of the transistors electrically connected in series) that are electrically connected in parallel. For each pair, one of the transistors has a gate node electrically connected to the v_tia_dac to bias that resistor to have a resistance, and the other of the transistors has a gate node electrically connected to a respective bit position of the tia_ictrl to selectively and operably electrically connect the respective pair of transistors in the parallel configuration.

Figure 8:
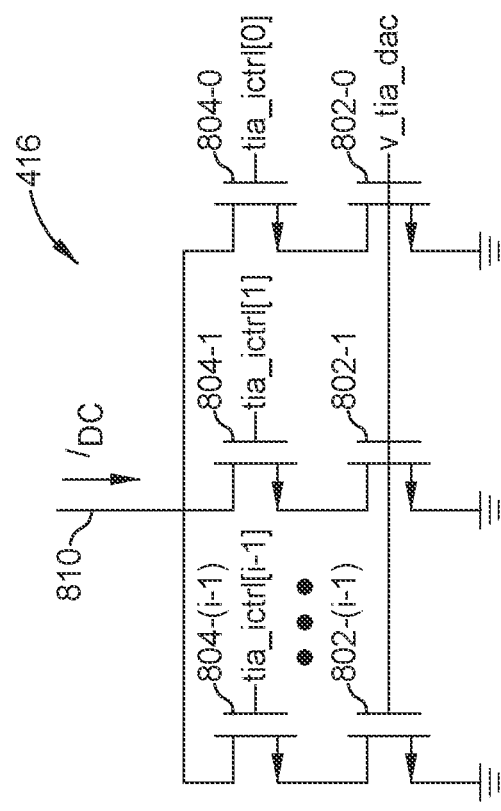
FIG. 8 is a circuit schematic of a controllable current source according to some examples.

Referring briefly to FIG. 8 to illustrate the v_tia_dac and tia_ictrl, an example controllable current source 416 is shown. The controllable current source 416 includes i number of serially connected pairs of n-type transistors 802-0, 804-0, 802-1, 804-1, . . . 802-(i–1), 804-(i–1) (e.g., n-type field effect transistors (FETs)).

For each pair of serially connected pairs of n-type transistors 802, 804, a source node of the n-type transistor 802 is electrically connected to a power supply node (e.g., a ground node); a drain node of the n-type transistor 802 is electrically connected to a source node of the n-type transistor 804; and a drain node of the n-type transistor 804 is electrically connected to a node 810. Hence, the i number of serially connected pairs of n-type transistors 802, 804 are electrically connected in parallel. The respective gate nodes of the n-type transistors 802 are electrically connected to a node on which the v_tia_dac is applied. Each gate node of the n-type transistors 804 is electrically connected to a node on which a respective bit value of the tia_ictrl is applied. For example, the gate node of the n-type transistor 804-0 is electrically connected to a node on which tia_ictrl[0] is applied; gate node of the n-type transistor 804-1 is electrically connected to a node on which tia_ictrl[1] is applied; etc. The v_tia_dac can bias the n-type transistors 802 to have a desired resistance. The bit positions of the tia_ictrl can selectively cause the n-type transistors 804 to individually be in an open (e.g., non-conducting) state or in a closed (e.g., conducting) state to selectively and operably connect the n-type transistors 802 in parallel to achieve an effective resistance. Operably electrically connecting the biased n-type transistors 802 in parallel can control the current $I_{DC}$ flowing through the node 810.

Referring back to FIG. 6, the synchronizing circuit 610 is configured to synchronize an input signal (tia_in) from the slicer circuit 402 with the track_clk. The synchronizing circuit 610 can be or include a clock triggered flip-flop, for example. The synchronizing circuit 610 outputs the synchronized tia_in to the tracking circuit 612.

The tracking circuit 612 is configured to track the tia_in and responsively output various codes for controlling the controllable current source 416 (e.g., for DC settings tracking). The tracking circuit 612 is configured to receive the track_clk from the clock frequency divider circuit 602, the sampling_clk from the clock generation circuit 604, the synchronized tia_in from the synchronizing circuit 610, the $MIN_1$ and $MAX_1$ from the max/min calculation circuit 608, and a programmable DC tracking confidence vote value (prog_tia_dc_vote). The tracking circuit 612 is further configured to generate and output the tia_dac_code, the tia_ictrl, and a track DC settings phase completed signal (tia_dc_track_done).

The prog_tia_dc_vote is or indicates a number of sampling cycles within a predefined number of cycles of the sampling_clk where the number of logical "1"s captured from the tia_in (based on the track_clk) is equal to or greater than the $MIN_1$ and less than or equal to the $MAX_1$ to determine if the DC settings tracking phase is complete.

The tia_dc_track_done indicates whether the DC settings tracking phase is complete. In this example, the tia_dc_track_done is a logical "0" while the DC settings tracking phase is ongoing, and is a logical "1" when the DC settings tracking phase is complete.

If the number of logical "1"s captured based on the track_clk for a respective cycle of the sampling_clk is equal to or greater than the $MIN_1$ and less than or equal to the $MAX_1$ for prog_tia_dc_vote number of cycles before the predetermined number of cycles of the sampling_clk occurs, the tia_dc_track_done is set to a logical "1" to indicate that the DC settings tracking phase is complete; otherwise, after the predetermined number of cycles of the sampling_clk occurs, the tia_dac_code and/or tia_ictrl are adjusted to adjust the current $I_{DC}$ of the controllable current source 416, and another iteration of the predetermined number of cycles is performed to continue the DC settings tracking phase. Additional details of this DC settings tracking phase are described subsequently.

The tracking circuit 612 outputs the tia_dc_track_done, which, as indicated above, is set to a logical "0" during the DC settings tracking phase and to a logical "1" when the DC settings tracking phase is completed. The tia_dc_track_done is inverted and input to a "1"-selection input node of the multiplexer 614. A logical "1" is input to a "0"-selection input node of the multiplexer 614. The selection control input node of the multiplexer 614 receives a transimpedance stage DC tracking enable signal (tia_dc_track_en), which may be a user-settable enable signal. The output node of the multiplexer 614 is communicatively coupled to the selection control input node of the multiplexer 606. When DC settings tracking is disabled (such that tia_dc_track_en is set to a logical "0"), the multiplexer 614 outputs a logical "1" to the selection control input node of the multiplexer 606, which causes the multiplexer 606 to output the slicer_clk_peaklock as the slicer_clk to the slicer circuit 402. When DC settings tracking is enabled (such that tia_dc_track_en is set to a logical "1"), the multiplexer 614 outputs the inverted tia_dc_track_done to the selection control input node of the multiplexer 606, which causes the multiplexer 606 to output the slicer_clk_peaklock as the slicer_clk to the slicer circuit 402 when the DC settings tracking phase is complete (e.g., when tia_dc_track_done is a logical "1") and to output the track_clk as the slicer_clk to the slicer circuit 402 during the DC settings tracking phase (e.g., when tia_dc_track_done is a logical "0").

Figure 9:
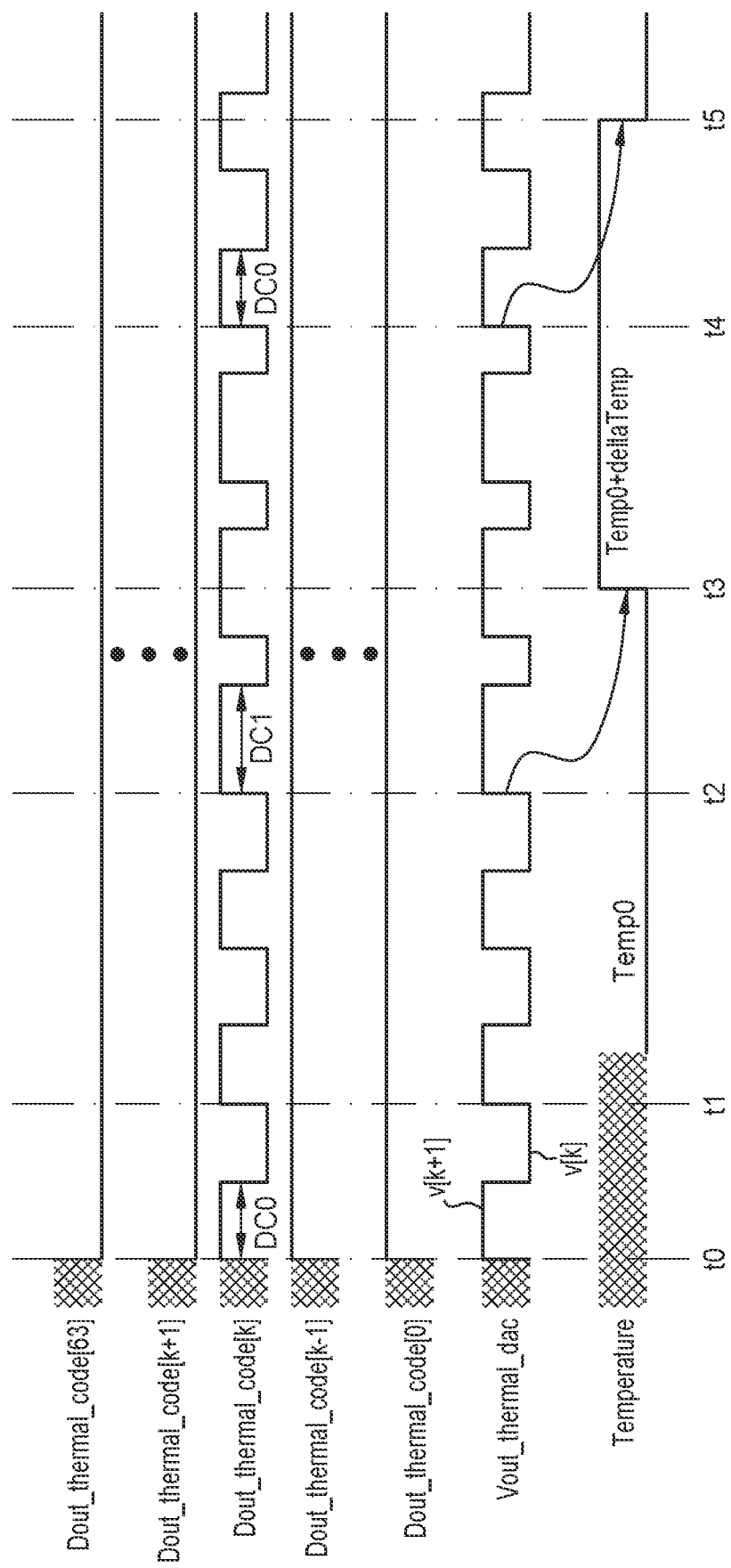
FIG. 9 is a timing diagram of a thermal code output by the DSP, the voltage output from the DAC of FIG. 4, and the temperature of the heater of FIG. 4 according to some examples.

Before continuing with the tracking circuit 612 and the PWM circuit 616, signals output from the PWM circuit 616 to the DAC 212 are described. An output DAC thermal code (Dout_thermal_code[63:0]) is a multi-bit value (e.g., a sixty-four bit thermal code in the illustrated example) output from the PWM circuit 616 to the DAC 212. In this example, the DAC 212 converts the thermal code of the Dout_thermal_code[63:0] to the Vout_thermal_dac that is output to the heater 228. FIG. 9 illustrates aspects of these signals. At any instance, the Dout_thermal_code[63:0] can have a selected k-bit position (Dout_thermal_code[k]) that has a frequency of the pwm_mode_clk, and the Dout_thermal_code[k] (and in some scenarios, with Dout_thermal_code[k+1] or Dout_thermal_code[k−1]) can be dithered with a selected duty cycle. One cycle of the pwm_mode_clk is between, e.g., time t0 and time t1. Further, three cycles of the pwm_mode_clk are between time t0 and time t2 for illustrative purposes.

Dout_thermal_code[k] has a duty cycle DC0 between time t0 and time t2. For illustrative purposes, the duty cycle DC0 is 50%. Between time t0 and time t2, bit position(s) from the (k−1)-bit position (Dout_thermal_code[k−1]) to the 0-bit position (Dout_thermal_code[0]) are a logical "1". Bit position(s) from the (k+1)-bit position (Dout_thermal_code[k+1]) to the 63-bit position (Dout_thermal_code[63]) are a logical "0". The bit positions of Dout_thermal_code[63:0] having these values between time t0 and time t2 causes Vout_thermal_dac to oscillate between voltage v[k] and voltage v[k+1] with a duty cycle corresponding to the duty cycle DC0, which causes the temperature at the heater 228 to be a temperature Temp0, like described above with respect to FIG. 7.

At time t2, the duty cycle of Dout_thermal_code[k] is increased to duty cycle DC1. Dout_thermal_code[k] has the duty cycle DC1 between time t2 and time t4. For illustrative purposes, duty cycle DC0 is 70%. Between time t2 and time t4, Dout_thermal_code[(k−1):0] are a logical "1", and Dout_thermal_code[63:(k+1)] are a logical "0". The bit positions of Dout_thermal_code[63:0] having these values between time t2 and time t4 causes Vout_thermal_dac to oscillate between voltage v[k] and voltage v[k+1] with a duty cycle corresponding to duty cycle DC1. Vout_thermal_dac between time t2 and time t4 causes the temperature at the heater 228 to increase to a temperature Temp0+deltaTemp, like described above with respect to FIG. 7. As illustrated, the temperature at the heater 228 increases from the temperature Temp0 to the temperature Temp0+deltaTemp at time t3 subsequent to the increase in duty cycle at time t2. In some examples, the delay between the time at which the duty cycle of Dout_thermal_code[k] is increased (e.g., at time t2) to the time at which the temperature at the heater 228 reaches the temperature Temp0+deltaTemp (e.g., at time t3) is on the order of 6 μs. Further, in some examples, a cycle of the pwm_mode_clk can be on the order of tens of nanoseconds, and hence, multiple cycles of oscillating the Dout_thermal_code[k] may occur between the time at which the duty cycle is increased and the time at which the temperature at the heater 228 reaches the temperature Temp0+deltaTemp.

At time t4, the duty cycle of Dout_thermal_code[k] is decreased to duty cycle DC0. Dout_thermal_code[k] has the duty cycle DC0 subsequent to time t4 in FIG. 9. At and subsequent to time t4, Dout_thermal_code[(k−1):0] are a logical "1", and Dout_thermal_code[63:(k+1)] are a logical "0". The bit positions of Dout_thermal_code[63:0] having these values subsequent to time t4 causes Vout_thermal_dac to oscillate between voltage v[k] and voltage v[k+1] with a duty cycle corresponding to duty cycle DC0. Vout_thermal_dac subsequent to time t4 causes the temperature at the heater 228 to decrease to a temperature Temp0. As illustrated, the temperature at the heater 228 decreases from the temperature Temp0+deltaTemp to the temperature Temp0 at time t5 subsequent to the decrease in duty cycle at time t4.

The temperature at the heater 228 can be controlled by selecting which k-bit position of the Dout_thermal_code[63:0] is to be oscillated and by selecting the duty cycles for dithering the Dout_thermal_code[k]. Selecting a value for k determines the voltage levels between which the Vout_thermal_dac oscillates. In the illustrated example, Vout_thermal_dac can be one of sixty-five possible voltages (v[0], v[1], . . . v[64]) since the Dout_thermal_code[63:0] is a sixty-four bit code. The available voltages sequentially increase such that v[0]<v[1]<v[2]< . . . <v[64]. Hence, selecting a larger value of k can result in voltages v[k], v[k+1] being greater levels, and conversely, selecting a smaller value of k can result in voltages v[k], v[k+1] being lower levels. Selecting these voltage levels can determine a possible range of temperatures (e.g., from temperature Temp[k] to temperature Temp[k+1]) that can be achieved at the heater 228.

Selecting the duty cycle of dithering the Dout_thermal_code[k] can achieve a temperature at the heater 228 that is in the range from temperature Temp[k] to temperature Temp[k+1]. The duty cycle can achieve interpolation of the temperature at the heater 228 within the range from temperature Temp[k] to temperature Temp[k+1] due to the accrual (e.g., integration) of thermal energy converted by the heater 228. Lower duty cycles can cause the temperature at the heater 228 to approach the temperature Temp[k], whereas higher duty cycles can cause the temperature at the heater 228 to approach the temperature Temp[k+1].

Although the illustration of FIG. 9 shows Dout_thermal_code[63:0] where k is not zero and is not sixty-three (e.g., where some bit positions are each a logical "1" and other bit positions are each a logical "0"), k can be zero and can be sixty-three. Further, the duty cycle of Dout_thermal_code[k] can be 0% and can be 100%. Where k is zero and the duty cycle is 0% in some examples, Dout_thermal_code[63:0] is at a saturation minimum, and where k is sixty-three and the duty cycle is 100% in some examples, Dout_thermal_code[63:0] is at a saturation maximum.

Further, as indicated by some examples scenarios below, dithering between different duty cycles can cause multiple bit positions of the Dout_thermal_code[63:0] to be oscillated with a duty cycle. For example, if a dither step increase is a 20% duty cycle and a duty cycle of a k-bit position is 90%, the duty cycle can be dithered between Dout_thermal_code[k] oscillating at a 90% duty cycle (where Dout_thermal_code[(k-1):0] are a logical "1", and Dout_thermal_code[63:(k+1)] are a logical "0") and Dout_thermal_code[k+1] oscillating at a 10% duty cycle (where Dout_thermal_code[k:0] are a logical "1", and Dout_thermal_code[63:(k+2)] are a logical "0").

Referring back to FIG. 6, the tracking circuit 612 is configured to track the tia_in and responsively output a duty code (duty_code) and k-level select signal (k_sel) to the PWM circuit 616 for controlling the heater 228 (e.g., for temperature settings tracking). The tracking circuit 612 is configured to receive a programmable PWM resolution value (prog_pwm_res) and a programmable PWM step value (prog_pwm_step). The prog_pwm_res is a value that indicates the frequency at which one or more bit positions of Dout_thermal_code[63:0] oscillates (e.g., the frequency of the pwm_mode_clk described above). The prog_pwm_step is a value that indicates a step size for increasing the duty_code. Together, the prog_pwm_res and prog_pwm_step can be used to determine, explicitly or implicitly, available values for the duty_code. As will be detailed subsequently, the k_sel indicates which k-bit position of Dout_thermal_code[63:0] will be oscillated with a duty cycle indicated by duty_code when the sampling_clk is logically low.

In some examples, the prog_pwm_res is a value that indicates the number of cycles of the dsp_clk per one cycle of the pwm_mode_clk, and the prog_pwm_step indicates a number of cycles of the dsp_clk per increment or decrement of the duty_code. In an example, the dsp_clk has a frequency of 875 MHz; the prog_pwm_res indicates 16 or 64 cycles of the dsp_clk per one cycle of the pwm_mode_clk; and prog_pwm_step indicates 1, 2, 4, or 8 cycles of the dsp_clk per increment or decrement of the duty_code. Table 3 details this example with resulting available values of the duty_code.

TABLE 3

| f$_{dsp\_clk}$ | prog_pwm_res | f$_{pwm\_mode\_clk}$ = f(prog_pwm_res) | prog_pwm_step[1:0] | duty_code |
|---|---|---|---|---|
| 875 MHz | 0 (64:1 dsp_clk cycles: pwm_mode_clk cycles) | 13.67 MHz | 00 (1 dsp_clk cycle per 64 dsp_clk cycles per inc/dec) | 63, 62, . . . 0 |
| | | | 01 (2 dsp_clk cycle per 64 dsp_clk cycles per inc/dec) | 62, 60, . . . 0 |
| | | | 10 (4 dsp_clk cycle per 64 dsp_clk cycles per inc/dec) | 60, 56, . . . 0 |
| | | | 11 (8 dsp_clk cycle per 64 dsp_clk cycles per inc/dec) | 56, 48, . . . 0 |
| | 1 (16:1 dsp_clk cycles: pwm_mode_clk cycles) | 54.69 MHz | 00 (4 dsp_clk cycle per 64 dsp_clk cycles per inc/dec) | 60, 56, . . . 0 |
| | | | 01 (8 dsp_clk cycle per 64 dsp_clk cycles per inc/dec) | 56, 48, . . . 0 |
| | | | 10 (16 dsp_clk cycle per 64 dsp_clk cycles per inc/dec) | 48, 32, 16, 0 |
| | | | 11 (32 dsp_clk cycle per 64 dsp_clk cycles per inc/dec) | 32, 0 |

The tracking circuit 612 is configured to capture a predetermined number of samples of the tia_in at respective falling edges of the sampling_clk and is configured to, based on the captured samples, increase or decrease the k_sel and/or the duty_code during temperature settings tracking. At a first iteration for temperature settings tracking, the k_sel and duty_code can be initialized to some values. During temperature settings tracking, the tracking circuit 612 captures a predetermined n number of samples of tia_in. The tracking circuit 612 determines whether the number of logical "1"s is greater or equal to half of the predetermined n number. If so, the tracking circuit 612 increases the duty_code to the next available value, unless the duty_code is at a highest available value. When the duty_code is a highest available value, the tracking circuit 612 increases the k_sel by one (unless the k_sel is at a highest available value), and resets the duty_code to the lowest available value. If the k_sel and duty_code are at respective highest available values, the output signals from the PWM circuit 616 are saturated, and the values of k_sel and duty_code are maintained. In such a scenario, an error flag may be set.

The following pseudocode illustrates how k_sel and duty_code can be incremented based on the example in Table 3 above. This pseudocode mathematically, and implicitly, determines the next available duty_code, and by concatenating the k_sel and duty_code, increments the k_sel and resets the duty_code under appropriate circumstances.

temp_incr=(k_sel×$2^6$)+duty_code+
$2^{[(2 \times prog\_pwm\_res)+prog\_pwm\_step]}$//Concatenate k_sel and duty_code; add increment step size
if(temp_incr<4096)   {k_sel=temp_incr[11:6]; duty_code=temp_incr[5:0]  }//Extract incremented k_sel and duty_code from temp_incr when k_sel and duty_code were not saturated and can be increased If the number of logical "1"s that were captured is not greater or equal to half of the predetermined n number, the tracking circuit 612 decreases the duty_code to the next available value, unless the duty_code is at a lowest available value. When the duty_code is a lowest available value, the tracking circuit 612 decreases the k_sel by one (unless the k_sel is at a lowest available value), and resets the duty_code to the highest available value. If the k_sel and duty_code are at respective lowest available values, the output signals from the PWM circuit 616 are saturated, and the values of k_sel and duty_code are maintained. In such a scenario, an error flag may be set.

The following pseudocode illustrates how k_sel and duty_code can be decremented based on the example in Table 3 above. This pseudocode mathematically, and implicitly, determines the next available duty_code, and by concatenating the k_sel and duty_code, decrements the k_sel and resets the duty_code under appropriate circumstances.

temp_incr=(k_sel×$2^6$)+duty_code−
$2^{[(2 \times prog\_pwm\_res)+prog\_pwm\_step]}$//Concatenate k_sel and duty_code; subtract increment step size
if(temp_incr>−1)   {k_sel=temp_incr[11:6]; duty_code=temp_incr[5:0]  }//Extract incremented k_sel and duty_code from temp_incr when k_sel and duty_code were not saturated and can be decreased If either of the k_sel and/or duty_code is modified (e.g., increased, decreased, or reset) by the tracking circuit 612, the tracking circuit 612 resets the tia_dc_track_done to a logical "0", and resets the tia_dac_code and tia_ictrl to zero. After maintaining the values of the k_sel and duty_code or resetting tia_dc_track_done, tia_dac_code, and tia_ictrl, the temperature settings tracking is completed, and the tracking circuit 612 loops back to DC settings tracking.

The tracking circuit 612 can implement any logic, state machine (e.g., a finite state machine), and/or other circuit, which may further execute machine-executable instructions, to implement the DC settings tracking and the temperature settings tracking.

Figure 10:
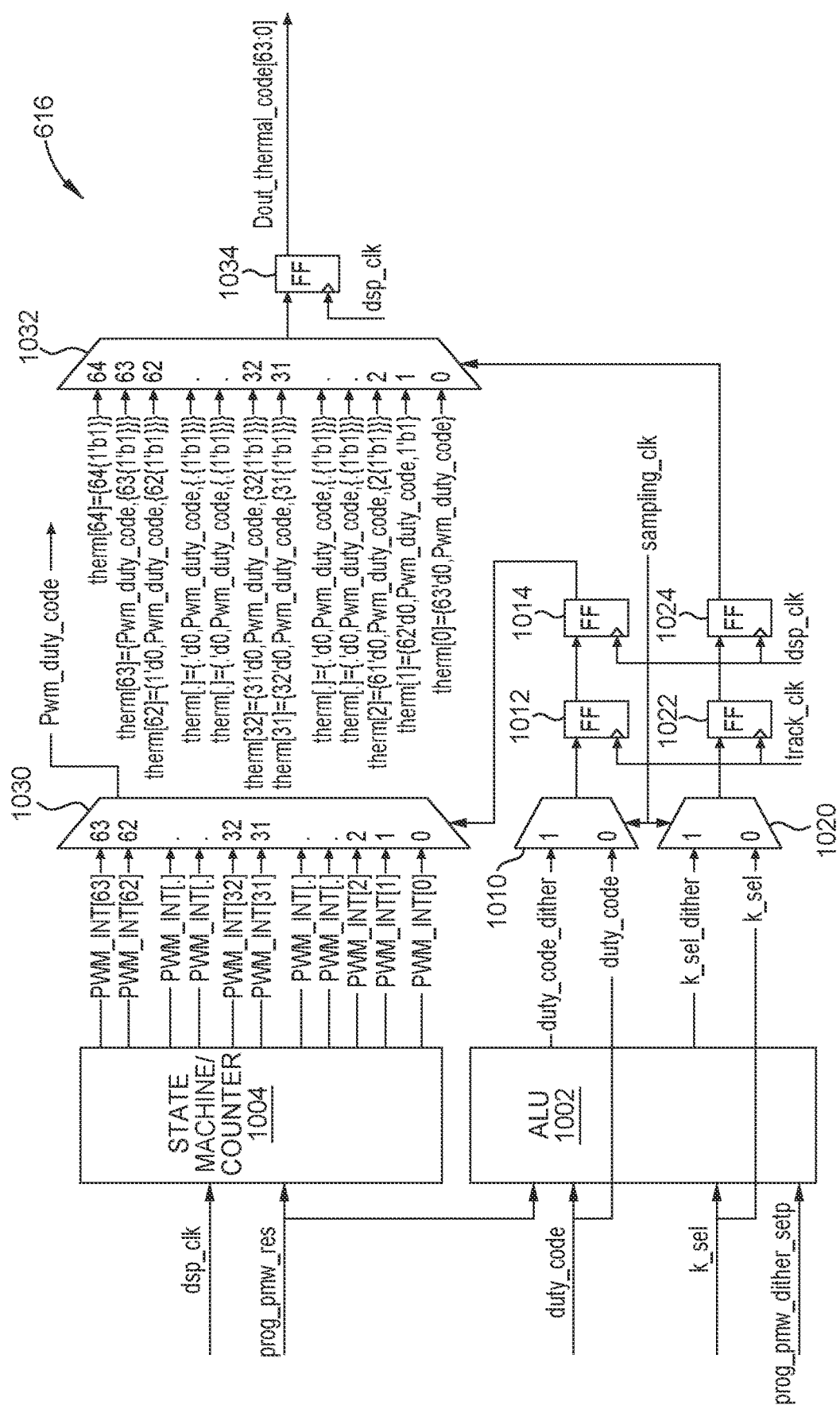
FIG. 10 is a schematic of a pulse width modulation (PWM) circuit of the DSP according to some examples.

In conjunction with FIG. 6, FIG. 10 is a schematic of the PWM circuit 616 according to some examples. The PWM circuit 616 is configured to receive the dsp_clk, the track_clk, the prog_pwm_res, a programmable duty cycle dither step value (prog_pwm_dither_step), the sampling_clk, the k_sel, and the duty_code and is configured to generate and output the Dout_thermal_code[63:0]. The PWM circuit 616 is configured to generate a dithering k-level select value (k_sel_dither) and a dithering duty code value (duty_code_dither) based on the k_sel, duty_code, and prog_pwm_dither_step, and is configured to generate and output the Dout_thermal_code[63:0] based on the k_sel and duty_code when the sampling_clk is logically low and based on the k_sel_dither and duty_code_dither when the sampling_clk is logically high.

The PWM circuit 616 includes an arithmetic/logic unit (ALU) 1002 that is configured to generate the k_sel_dither and duty_code_dither generally by adding a duty cycle step size indicated by the prog_pwm_dither_step to the k_sel and duty_code. The ALU 1002 of the PWM circuit 616 concatenates the k_sel and duty_code, where the duty_code is the least significant bit positions and the k_sel is the next more significant bit positions, and adds the duty cycle step size indicated by the prog_pwm_dither_step to the concatenated k_sel and duty_code. If, after the addition, the next most significant bit position after the number of bit positions of the concatenated k_sel and duty_code is a "1", the remaining lower significant bit positions of the result may be cleared. If, after the addition, the next most significant bit position after the number of bit positions of the concatenated k_sel and duty_code is a "0", that bit position and the remaining lower significant bit positions of the result that correspond in placement to the k_sel (from the concatenation) are the k_sel_dither, and the least significant bit positions that correspond in placement to the duty_code (from the concatenation) are the duty_code_dither. Additionally, the ALU 1002 can include logic to perform a check operation on the prog_pwm_dither_step based on the prog_pwm_res. As will become apparent subsequently, the available duty cycles, and hence, the available duty_code_dither, may be restricted based on the mode indicated by prog_pwm_res. In the example of Table 3, no check is performed on the prog_pwm_dither_step when prog_pwm_res is "0", but a check is performed to round prog_pwm_dither_step down to the next multiple of four when the prog_pwm_dither_step is not a multiple of four and prog_pwm_res is "1". The following pseudocode illustrates an example of this operation of the ALU 1002 with various values having the given bit-lengths.

if(prog_pwm_res==1)  {prog_pwm_dither_step=integer (prog_pwm_dither_step/4)×4}//round prog_pwm_dither_step down to nearest multiple of 4 when prog_pwm_dither_step is not a multiple of 4 in the mode indicated by prog_pwm_res=1
temp_concat=(k_sel×$2^6$)+duty_code//temp_concat being 13 bits ([12:0]) and k_sel and duty_code each being 6 bits ([5:0]); concatenate k_sel and duty_code with a "0" in temp_concat[12]
temp_accum_dither=temp_concat+prog_pwm_dither_step
if(temp_accum_dither[12]−1)  {temp_accum_dither= 4096}//if temp_accum_dither>=4096, set temp_accum_dither=4096 (temp_accum_dither[12]=1 and temp_accum_dither[11:0]=0)

k_sel_dither=temp_accum_dither[12:6]//extract k_sel_
    dither from temp_accum_dither
duty_code_dither=temp_accum_dither[5:0]//extract
    duty_code_dither from temp_accum_dither Table 4 below illustrates some example values generated by the above pseudocode.

TABLE 4

| k_sel [5:0] | duty_ code [5:0] | temp_ concat [11:0] | prog_ pwm_ dither_ step | temp_ accum_ dither [12:0] | k_sel_ dither[6:0] = temp_ accum_ dither[12:6] | duty_code_ dither[5:0] = temp_ accum_ dither[5:0] |
|---|---|---|---|---|---|---|
| 1 | 2 | 66 | 0 | 66 | 1 | 2 |
| 1 | 31 | 95 | 32 | 127 | 1 | 63 |
| 1 | 32 | 96 | 64 | 160 | 2 | 32 |
| 1 | 62 | 126 | 1 | 127 | 1 | 63 |
| 1 | 63 | 127 | 2 | 129 | 2 | 1 |
| 0 | 1 | 1 | 4093 | 4094 | 63 | 62 |
| 31 | 2 | 1986 | 2000 | 3986 | 62 | 18 |
| 31 | 31 | 2015 | 2049 | 4064 | 63 | 32 |
| 31 | 32 | 2016 | 64 | 2080 | 32 | 32 |
| 31 | 62 | 2046 | 2049 | 4095 | 63 | 63 |
| 31 | 63 | 2047 | 2060 | 4096 | 64 | 0 |
| 63 | 63 | 4095 | 31 | 4096 | 64 | 0 |

Figure 11A:
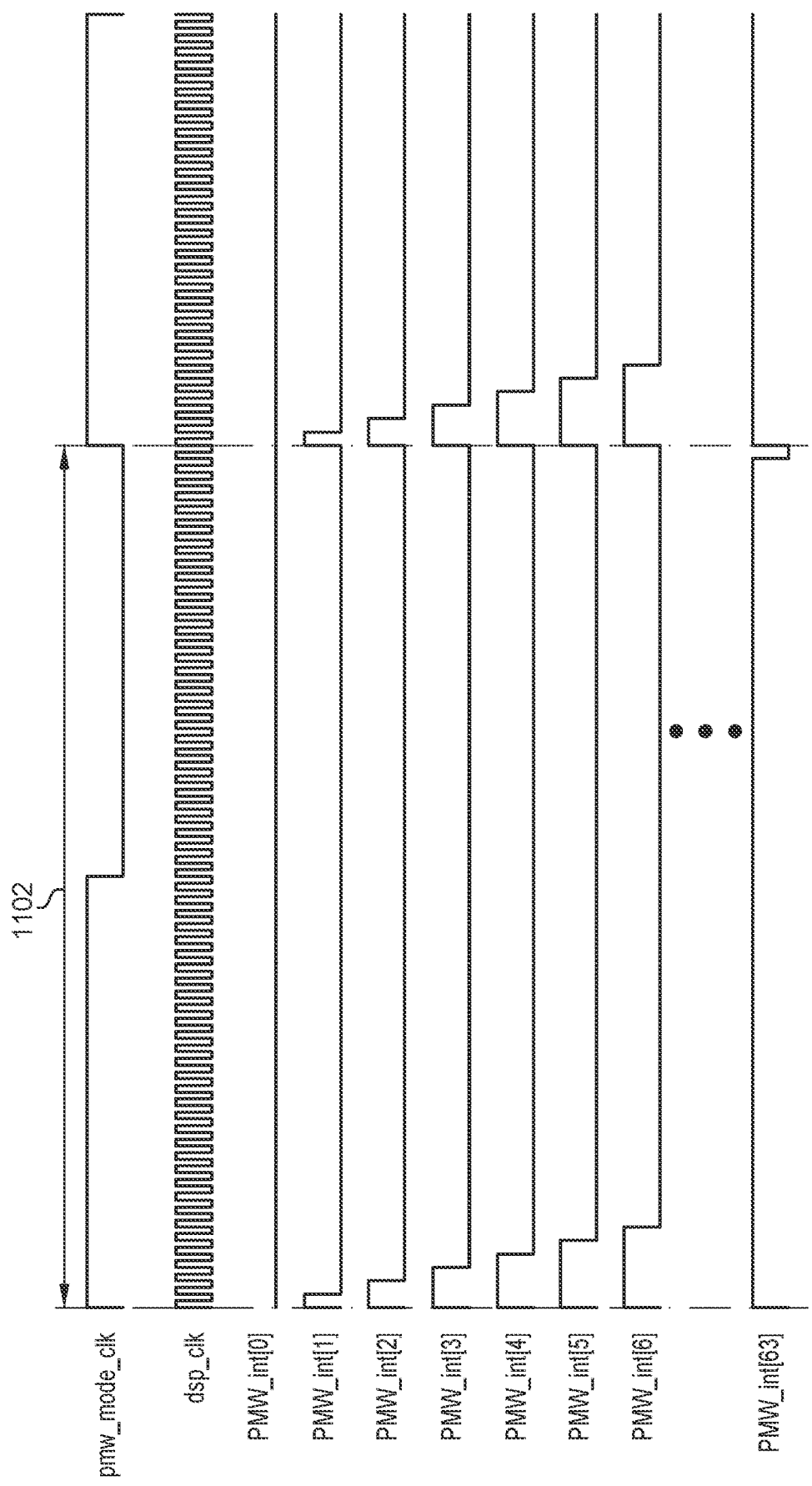

The PWM circuit 616 includes a state machine and/or counter 1004 that is configured to generate and output intermediate signals (PWM_int[m]) having different duty cycles, where the PWM_int[m] are based on the dsp_clk and prog_pwm_res. For example, for a given m, the PWM_int[m] can be generated by asserting a logical "1" as the PWM_int[m] for a number of cycles of the dsp_clk based on the m position and the prog_pwm_res, and subsequently by asserting a logical "0" as the PWM_int[m] for a remaining number of cycles of the dsp_clk based on the prog_pwm_res. FIGS. 11A and 11B are timing diagrams of various PWM_int[m] based on different prog_pwm_res according to some examples.

FIG. 11A illustrates signals when prog_pwm_res=0 as shown in Table 3 (e.g., indicating a frequency of pwm_mode_clk of 13.67 MHz or 64 cycles of the dsp_clk per one cycle of the pwm_mode_clk). In FIG. 10, the pwm_mode_clk is not explicitly generated, but is shown in FIG. 11A as a reference. FIG. 11A illustrates a span 1102 that is 64 cycles of the dsp_clk, which corresponds to one cycle of each PWM_int[m] and the pwm_mode_clk in this mode. In this mode, the state machine and/or counter 1004, at the beginning of each cycle of the respective PWM_int[m], sets the PWM_int[m] to a logical "1". The state machine and/or counter 1004 maintains the PWM_int[m] as a logical "1" for m number of cycles of the dsp_clk (e.g., by counting the number of rising edges of the dsp_clk). At the (m+1) cycle of the dsp_clk, the state machine and/or counter 1004 sets the PWM_int[m] to a logical "0" and maintains the PWM_int[m] at that value through the remaining number of cycles of the dsp_clk in the cycle of the PWM_int[m]. As examples, PWM_int[0] is a logical "1" for no cycles of the dsp_clk and is a logical "0" for each cycle of the dsp_clk. PWM_int[1] is a logical "1" for one initial cycle of the dsp_clk in the cycle of PWM_int[1] and is a logical "0" for the sixty-three subsequent cycles of the dsp_clk in the cycle of PWM_int[1]. PWM_int[2] is a logical "1" for two initial cycles of the dsp_clk in the cycle of PWM_int[2] and is a logical "0" for the sixty-two subsequent cycles of the dsp_clk in the cycle of PWM_int[2]. PWM_int[63] is a logical "1" for sixty-three initial cycles of the dsp_clk in the cycle of PWM_int[63] and is a logical "0" for the last cycle of the dsp_clk in the cycle of PWM_int[63].

FIG. 11B illustrates signals when prog_pwm_res=1 as shown in Table 3 (e.g., indicating a frequency of pwm_mode_clk of 54.69 MHz or 16 cycles of the dsp_clk per one cycle of the pwm_mode_clk). Like FIG. 11A, the pwm_mode_clk is shown in FIG. 11B as a reference. FIG. 11B further illustrates a span 1104 that is 16 cycles of the dsp_clk, which corresponds to one cycle of each PWM_int[m] and the pwm_mode_clk in this mode. In this mode, the state machine and/or counter 1004, at the beginning of each cycle of the respective PWM_int[m], sets the PWM_int[m] to a logical "1". The state machine and/or counter 1004 maintains the PWM_int[m] as a logical "1" for (m/4) number of cycles of the dsp_clk (e.g., by counting the number of rising edges of the dsp_clk). At the ((m/4)+1) cycle of the dsp_clk, the state machine and/or counter 1004 sets the PWM_int[m] to a logical "0" and maintains the PWM_int[m] at that value through the remaining number of cycles of the dsp_clk in the cycle of the PWM_int[m]. As examples, PWM_int[0] is a logical "1" for no cycles of the dsp_clk and is a logical "0" for each cycle of the dsp_clk. PWM_int[4] is a logical "1" for one initial cycle of the dsp_clk in the cycle of PWM_int[4] and is a logical "0" for the fifteen subsequent cycles of the dsp_clk in the cycle of PWM_int[4]. PWM_int[8] is a logical "1" for two initial cycles of the dsp_clk in the cycle of PWM_int[8] and is a logical "0" for the fourteen subsequent cycles of the dsp_clk in the cycle of PWM_int[8]. PWM_int[60] is a logical "1" for fifteen initial cycles of the dsp_clk in the cycle of PWM_int[60] and is a logical "0" for the last cycle of the dsp_clk in the cycle of PWM_int[60]. In this mode, the state machine and/or counter 1004 can disable any PWM_int[m] where m is not a multiple of 4.

As is apparent from FIGS. 11A and 11B, the duty cycle of PWM_int[m] increases with an increased value of m. Also, duty cycles can be distributed differently between the different modes illustrated in FIGS. 11A and 11B. For example, taking PWM_int[4] as an example, in FIG. 11A, PWM_int[4] is a logical "1" for the initial four cycles of the dsp_clk in the span 1102 and is a logical "0" for the remaining sixty cycles of the dsp_clk in the span 1102, whereas in FIG. 11B, PWM_int[4] is a logical "1" for four instances of one cycle of the dsp_clk distributed throughout the span 1102 and is a logical "0" for the remaining sixty cycles of the dsp_clk in the span 1102.

Referring back to FIG. 10, the PWM circuit 616 further includes multiplexers 1010, 1020, 1030, 1032 and flip-flops 1012, 1014, 1022, 1024, 1034. The multiplexer 1010 has a "0"-selection input node communicatively coupled to the ALU 1002 and configured to receive the duty_code, and has a "1"-selection input node communicatively coupled to the ALU 1012 and configured to receive the duty_code_dither. The multiplexer 1010 has a selection control input node configured to receive the sampling_clk. The multiplexer 1010 has an output node communicatively coupled to an input node of the flip-flop 1012. The flip-flop 1012 has an output node communicatively coupled to an input node of the flip-flop 1014. The flip-flop 1014 has an output node communicatively coupled to a selection control input node of the multiplexer 1030. The flip-flop 1012 has a clock input node configured to receive the track_clk, and the flip-flop 1014 has a clock input node configured to receive the dsp_clk. As should be apparent, each input node and output node of the multiplexer 1010 and flip-flops 1012, 1014 can be a multi-bit node. Hence, although the flip-flop 1012 or the flip-flop 1014 is schematically shown in the singular, multiple single-bit flip-flops, where each corresponds to a respective bit position, can be implemented for the illustrated flip-flop.

The multiplexer 1020 has a "0"-selection input node communicatively coupled to the ALU 1002 and configured to receive the k_sel, and has a "1"-selection input node communicatively coupled to the ALU 1002 and configured to receive the k_sel_dither. The multiplexer 1020 has a selection control input node configured to receive the sampling_clk. The multiplexer 1020 has an output node communicatively coupled to an input node of the flip-flop 1022. The flip-flop 1022 has an output node communicatively coupled to an input node of the flip-flop 1024. The flip-flop 1024 has an output node communicatively coupled to a selection control input node of the multiplexer 1032. The flip-flop 1022 has a clock input node configured to receive the track_clk, and the flip-flop 1024 has a clock input node configured to receive the dsp_clk. As should be apparent, each input node and output node of the multiplexer 1020 and flip-flops 1022, 1024 can be a multi-bit node. Hence, although the flip-flop 1022 or the flip-flop 1024 is schematically shown in the singular, multiple single-bit flip-flops, where each corresponds to a respective bit position, can be implemented for the illustrated flip-flop.

The multiplexer 1030, in the illustrated example, has sixty-four "m"-selection input nodes, where m is from 0 to 63, communicatively coupled to the ALU 1002 and configured to receive a respective PWM_int[m]. The multiplexer 1030 has an output node configured to output a PWM duty code signal (pwm_duty_code).

The multiplexer 1032, in the illustrated example, has sixty-five "q"-selection input nodes, where q is from 0 to 64. Each of the sixty-five "q"-selection input nodes is a 64-bit input node and is configured to receive a respective thermal code (therm[q]). For each therm[q], the pwm_duty_code output from the multiplexer 1030 is mapped to the q-bit position of the respective therm[q]; each bit position of the respective therm[q] that is less than q is set to a logical "1"; and each bit position of the respective therm[q] that is greater than q is set to a logical "0". Generally, for each therm[q], a 64-bit thermal code is generated, where the q-bit position is oscillating with the pwm_duty_code. Each bit position of the therm[64] is set to a logical "1" (e.g., each bit position of therm[64] is less than q=64). The therm[64] can be a saturation condition. The multiplexer 1032 has an output node communicatively coupled to an input node of the flip-flop 1034. The flip-flop 1034 has an output node that is an output node of the PWM circuit 616 on which the Dout_thermal_code[63:0] is provided. The flip-flop 1034 has a clock input node configured to receive the dsp_clk. As should be apparent, each input node and output node of the multiplexer 1032 and flip-flop 1034 is a 64-bit node in the illustrated example. Hence, although the flip-flop 1034 is schematically shown in the singular, sixty-four single-bit flip-flops, where each corresponds to a respective bit position, can be implemented for the illustrated flip-flop 1034.

In describing further operation of FIG. 10, operation of the flip-flops 1012, 1014, 1022, 1024, 1034 is omitted. These flip-flops generally synchronize signals to a respective clock, such as the track_clk or dsp_clk. Such operation is readily apparent to a person having ordinary skill in the art, and hence, is omitted for brevity.

In operation, the ALU 1002 generates and outputs the k_sel_dither and duty_code_dither as described above, and the state machine and/or counter 1004 generates and outputs the PWM_int[m], where m is 0 to 63, as described above. When the sampling_clk is logically low (e.g., corresponding to a "0"-selection for the multiplexers 1010, 1020), the multiplexer 1010 outputs the duty_code to the selection control input node of the multiplexer 1030, which causes the multiplexer 1030 to output the PWM_int[duty_code] as the pwm_duty_code. Hence, the multiplexer 1030 outputs a signal with a desired duty cycle. Further, when sampling_clk is logically low, the multiplexer 1020 outputs the k_sel to the selection control input node of the multiplexer 1032, which causes the multiplexer 1032 to output the therm[k_sel] as the Dout_thermal_code[63:0]. Hence, the multiplexer 1032 outputs a thermal code with the signal having the desired duty cycle at a desired bit position.

When the sampling_clk is logically high (e.g., corresponding to a "1"-selection for the multiplexers 1010, 1020), the multiplexer 1010 outputs the duty_code_dither to the selection control input node of the multiplexer 1030, which causes the multiplexer 1030 to output the PWM_int[duty_code_dither] as the pwm_duty_code. Hence, the multiplexer 1030 outputs a signal with a desired duty cycle. Further, when sampling_clk is logically high, the multiplexer 1020 outputs the k_sel_dither to the selection control input node of the multiplexer 1032, which causes the multiplexer 1032 to output the therm[k_sel_dither] as the Dout_thermal_code[63:0]. Hence, the multiplexer 1032 outputs a thermal code with the signal having the desired duty cycle at a desired bit position, which can be different than the thermal code output when the sampling_clk was logically low.

Generally, when the sampling_clk is logically low:
Dout_thermal_code[63:0]=therm[k_sel]={(63-k_sel)'d0, pwm_duty_code=PWM_int[duty_code], (k_sel)'b1}
When the sampling_clk is logically high:
Dout_thermal_code[63:0]=therm[k_sel_dither]={(63-k_sel_dither)'d0, pwm_duty_code=PWM_int[duty_code_dither], (k_sel_dither)'b1}

Figure 12A:
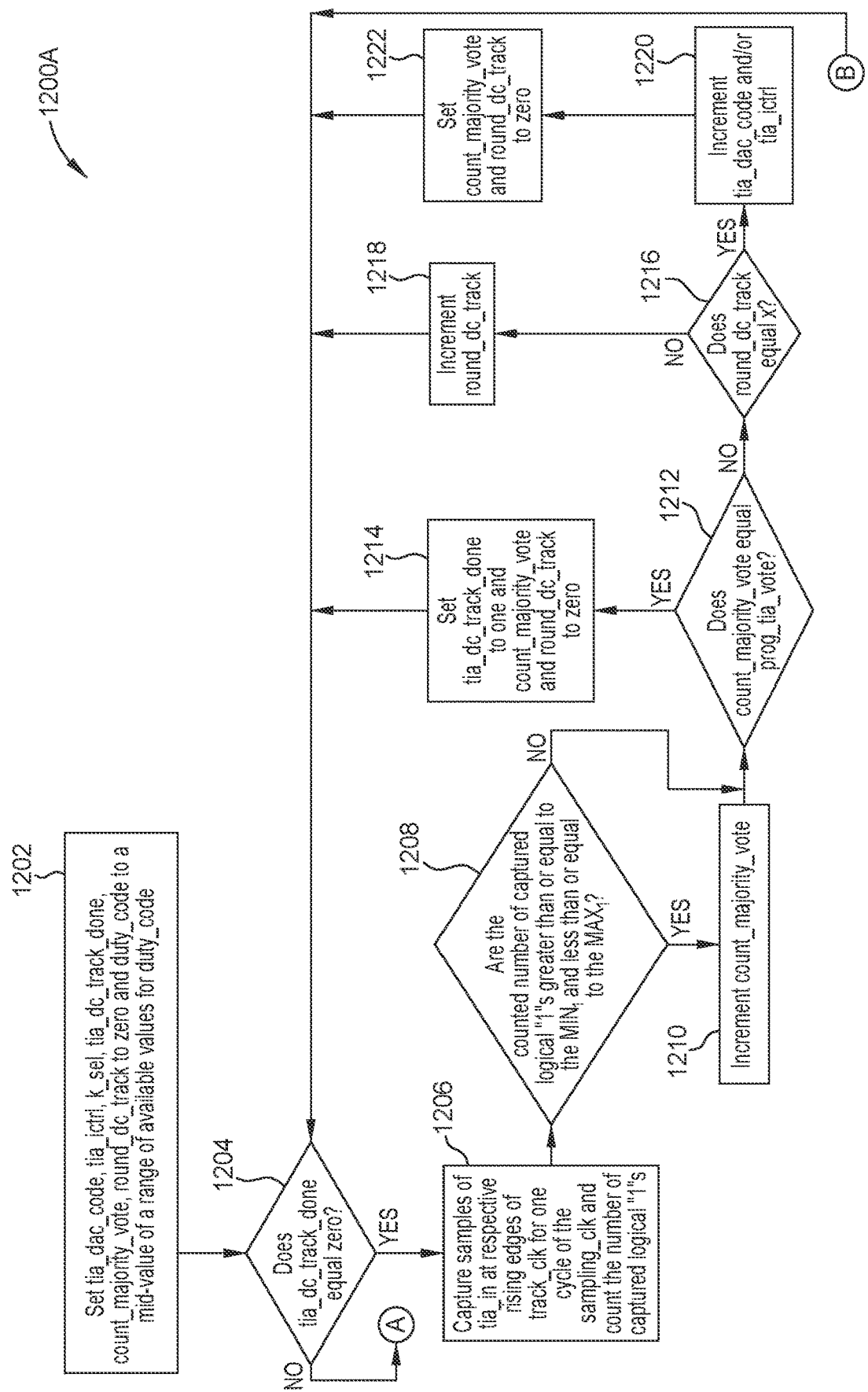
FIGS. 12A and 12B are a flowchart of operation of a tracking circuit of the DSP according to some examples.
Figure 12B:
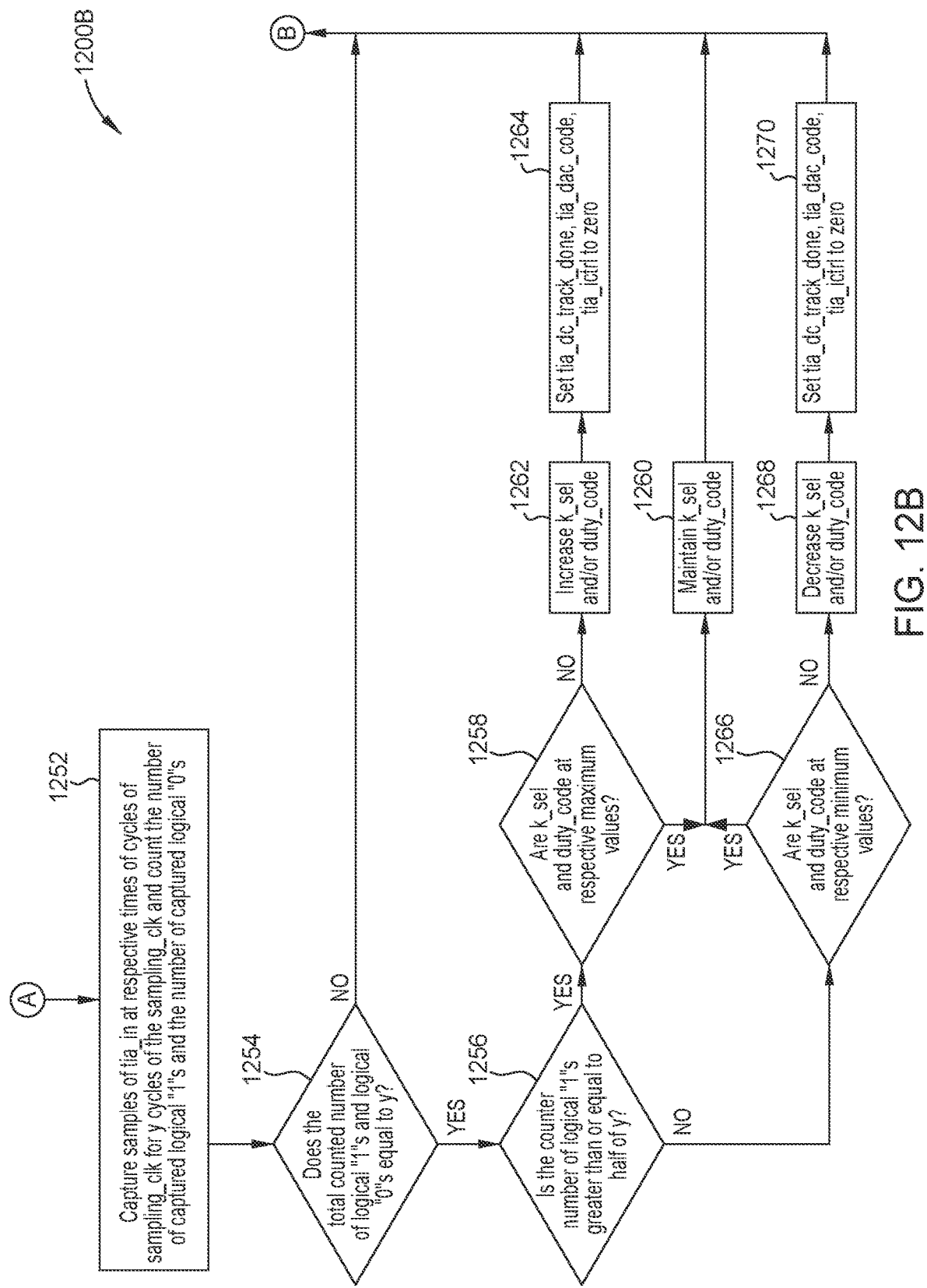

FIGS. 12A and 12B are a flowchart of operation 1200A, 1200B of the tracking circuit 612 of the DSP 406 according to some examples. For context, the overall operation of the DSP 406 will be described with the flowchart of FIGS. 12A and 12B. Generally, FIG. 12A shows the DC settings tracking, and FIG. 12B shows the temperature settings tracking.

At the outset, a user programs values for the various programmable values. A user can write values to memory, a register, or the like that is/are accessible to the DSP 406 for the programmable values. The user writes values for the prog_pwm_res, prog_pwm_step, prog_pwm_dither_step, prog_sampling_freq, prog_sampling_offset, prog_tia_dc_ratio, prog_tia_dc_vote, and tia_dc_track_en.

Further, the clock frequency divider circuit 602 generates the track_clk from the dsp_clk as described above. The clock generation circuit 604 generates the sampling_clk and slicer_clk_peaklock based on the prog_sampling_freq, prog_sampling_offset, and track_clk as described above. The max/min calculation circuit 608 calculates $MAX_1$ and $MIN_1$ based on the prog_tia_dc_ratio, prog_sampling_freq, and prog_sampling_offset as described above.

Referring to operation 1200A of FIG. 12A, at block 1202, the tia_dac_code, tia_ictrl, k_sel, tia_dc_track_done, a majority vote counter (count_majority_vote), a round track counter (round_dc_track) are set to zero, and the duty_code is set to a mid-value of a range of available values for duty_code. By setting the tia_dac_code and tia_ictrl to zero, the current generated by the controllable current source 416 is reduced to a minimal amount and/or turned off, which reduces removing a DC component from the current $I_{in}$ to a minimal amount and/or does not remove a DC component from the current lie. Setting duty_code to a mid-value (e.g., 32 in the example of FIG. 10) causes the multiplexer 1030 of the PWM circuit 616 to output a PWM_int[duty_code] when the sampling_clk is low such that the output PWM_int [duty_code] has a duty cycle at or near fifty percent. Setting k_sel to zero causes the multiplexer 1032 of the PWM circuit 616 to output, as the Dout_thermal_code[63:0], the therm[k_sel=0]={63'd0,pwm_duty_code=PWM_int [duty_code]} when the sampling_clk is low. Further, the ALU 1002 generates the k_sel_dither and duty_code_dither based on the k_sel and duty_code set at block 1202 and the prog_pwm_dither_step. The multiplexer 1032 of the PWM circuit 616 outputs, as the Dout_thermal_code[63:0], the therm[k_sel_dither]={(63−k_sel_dither)'d0, pwm_duty_code=PWM_int[duty_code_dither], (k_sel_dither)'b1} when the sampling_clk is high. Accordingly, the Dout_thermal_code[63:0] is set to dither between different duty codes based on the sampling_clk, which causes the Vout_thermal_dac and temperature at the heater 228 to responsively dither.

At block 1204, a determination is made whether the tia_dc_track_done is equal to zero. If the tia_dc_track_done is not equal to zero, the operation proceeds to temperature settings tracking in FIG. 12B, which is described subsequently. If the tia_dc_track_done is equal to zero, at block 1206, samples of tia_in are captured at respective rising edges of track_clk for one cycle of the sampling_clk, and the number of logical "1"s is counted. As indicated above, during one cycle of the sampling_clk, a duty cycle of Dout_thermal_code[63:0] dithers, which causes the temperature at the heater 228 to dither. Capturing samples of the tia_in through one cycle of the sampling_clk can result in samples being captured that are responses to different optical responses of the optical element 222 due to the different temperatures of the heater 228.

At block 1208, a determination is made whether the number of captured logical "1"s is greater than or equal to the $MIN_1$ and less than or equal to the $MAX_1$. Generally, the determination of block 1208 indicates whether the number of captured logical "1"s is within the error range indicated by the prog_tia_dc_ratio. If the number of captured logical "1"s is within $MIN_1$ and $MAX_1$, at block 1210, the count_majority_vote is incremented by one. Following block 1210 or if the number of captured logical "1"s is not within $MIN_1$ and $MAX_1$, at block 1212, a determination is made whether the count_majority_vote is equal to the prog_tia_dc_vote. If the count_majority_vote is equal to the prog_tia_dc_vote, at block 1214, the tia_dc_track_done is set to one, and the count_majority_vote and round_dc_track are set to zero. Following block 1214, operation loops back to block 1204.

If the count_majority_vote is not equal to the prog_tia_dc_vote, at block 1216, a determination is made whether the round_dc_track is equal to a predetermined number x. The predetermined number x can be a programmable value or can be coded into the algorithm. If the round_dc_track is not equal to the predetermined number x, at block 1218, the round_dc_track is incremented by one. Following block 1218, operation loops back to block 1204.

If the round_dc_track is equal to the predetermined number x, at block 1220, the tia_dac_code and/or the tia_ictrl is incremented. Incrementing the tia_dac_code and/or the tia_ictrl increases the current $I_{DC}$ through the controllable current source 416. The incrementing of one of the tia_dac_code and the tia_ictrl can be accompanied by the decreasing of the other in some situations. The way in which the tia_dac_code and the tia_ictrl are modified can be based on considerations such as the structure of the controllable current source 416 and a target step increase for each iteration of block 1220. For example, the tia_dac_code may be independently increased in a number of subsequent iterations of block 1220 without an increase of the tia_ictrl, until the tia_dac_code is saturated at another iteration of block 1220, at which iteration, the tia_dac_code is set to a reduced value and the tia_ictrl is increased. Even with a reduced tia_dac_code (and corresponding reduced v_tia_dac), increasing the tia_ictrl can cause another serially connected pair of n-type transistors 802, 804 to be operably electrically coupled between the node 810 and the power supply node (e.g., ground node) such that the cumulative current flowing through the channels of the n-type transistors 804 (and hence, the current $I_{DC}$) is increased. Following block 1220, at block 1222, the count_majority_vote and round_dc_track are set to zero, and operation loops back to block 1204.

Generally, the looping of operation by blocks 1204-1222 forms DC settings tracking. The round_dc_track counts the number of times samples are captured at block 1206 before the round_dc_track becomes equal to the x number and the tia_dac_code and/or tia_ictrl are increased. The count_majority_vote counts the number of times the samples that are captured at block 1206 are within the error range indicated by the $MAX_1$ and $MIN_1$ while the round_dc_track is less than the x number. When the count_majority_vote becomes equal to the prog_tia_dc_vote, the tia_dac_code and tia_ictrl are at values sufficient such that the captured samples are within the error range indicated by the $MAX_1$ and $MIN_1$ with a degree of confidence. The count_majority_vote being equal to the prog_tia_dc_vote causes the DC settings tracking to conclude, and causes the tia_dc_track_done to be set to one.

Generally, if, after x number of iterations (e.g., capturing samples for x number of cycles of the sampling_clk), the number of iterations where the captured samples were within the error range indicated by the $MIN_1$ and $MAX_1$ is less than the prog_tia_dc_vote, the current $I_{DC}$ is increased by incrementing the tia_dac_code and/or tia_ictrl, and subsequent iterations for DC settings tracking continue by resetting the count_majority_vote and round_dc_track. If, before the x number of iterations are completed, the number of iterations where the captured samples were within the error range indicated by the $MIN_1$ and $MAX_1$ is equal to the prog_tia_dc_vote, the DC settings tracking is concluded by setting the tia_dc_track_done to one (which causes block 1204 to cause the operation to proceed to temperature settings tracking), and the current $I_{DC}$ is set for temperature settings tracking. The count_majority_vote and round_dc_tracking are reset for a subsequent iteration of DC settings tracking following the temperature settings tracking.

Referring back to the operation 1200A of FIG. 12A, if the determination at block 1204 is that the tia_dc_track_done is not equal to zero (e.g., that the DC settings tracking is concluded), at block 1252, samples of tia_in are captured at respective times of cycles of the sampling_clk for y number of cycles of the sampling_clk, and the number of logical "1"s and the number of logical "0"s that were captured are counted. In some examples, each sample is captured while the sampling_clk is logically low and at a time in the respective cycle before and near to a rising edge of the sampling_clk. For example, each sample can be captured 10 cycles of the dsp_clk before a respective rising edge of the sampling_clk. A dedicated signal having a rising or falling edge corresponding to this sample time can be implemented.

At block 1254, a determination is made whether the total counted number of logical "1"s and logical "0"s equals to the y number. If not, an error occurred, and temperature settings tracking is concluded such that operation loops back to block 1204 for DC settings tracking. If the total counted number of logical "1"s and logical "0"s equals the y number, at block 1256, a determination is made whether the counted number of logical "1"s is greater than or equal to half of the y number. Generally, block 1256 determines whether more logical "1"s or more logical "0"s were counted.

If the counted number of logical "1"s is greater than or equal to half of the y number, at block 1258, a determination is made whether k_sel and duty_code are at respective maximum values. If k_sel and duty_code are both at respective maximum values (e.g., indicating that the Dout_thermal_code[63:0] is at a maximum duty code), at block 1260, k_sel and duty_code are maintained with the respective values, and an error flag may be set. Following block 1260, temperature settings tracking is concluded such that operation loops back to block 1204 for DC settings tracking. If either or both of k_sel and duty_code are not at a respective maximum value, at block 1262, k_sel and/or duty_code are increased, as described above. Following block 1262, at block 1264, the tia_dc_trackdone, tia_dac_code, and tia_ictrl are set to zero, which concludes the temperature settings tracking and resets variables for a subsequent DC settings tracking. Following block 1264, operation loops back to block 1204 for DC settings tracking.

If the counted number of logical "1"s is not greater than or equal to half of the y number, at block 1266, a determination is made whether k_sel and duty_code are at respective minimum values. If k_sel and duty_code are both at respective minimum values (e.g., indicating that the Dout_thermal_code[63:0] is at a minimum duty code), at block 1260, k_sel and duty_code are maintained with the respective values, and an error flag may be set. Following block 1260, temperature settings tracking is concluded such that operation loops back to block 1204 for DC settings tracking. If either or both of k_sel and duty_code are not at a respective minimum value, at block 1268, k_sel and/or duty_code are decreased, as described above. Following block 1268, at block 1270, the tia_dc_track_done, tia_dac_code, and tia_ictrl are set to zero, which concludes the temperature settings tracking and resets variables for a subsequent DC settings tracking. Following block 1270, operation loops back to block 1204 for DC settings tracking.

Changing the k_sel and duty_code causes the PWM circuit 616 to responsively change k_sel_dither and duty_code_dither. Changing k_sel, duty_code, k_sel_dither, and duty_code_dither causes the Dout_thermal_code[63:0] to dither between different duty codes, which in turn causes Vout_thermal_dac to dither between different duty cycles and possibly between different voltage levels. The change to Vout_thermal_dac causes the temperature at the heater 228 to increase or decrease.

The DC settings are determined based on samples captured at block 1206 across the dithering, based on the sampling_clk, between a first temperature and a second temperature (which results from the dithering duty cycles of the Dout_thermal_code[63:0]). In the described example, when the sampling_clk is logically high, a first temperature results at the optical element 222, and when the sampling_clk is logically low, a second temperature higher than the first temperature results at the optical element 222. Generally, the optical responses of the optical element 222 at the first temperature and the second temperature can be like shown in FIG. 3A or FIG. 3B.

In the RHS scenario of FIG. 3A, samples captured when the optical element 222 is at the second temperature and has the second response 306 having the magnitude 316 at the center wavelength (λc) 302 have a lower loss relative to samples captured when the optical element 222 is at the first temperature and has the first response 304 having the magnitude 314 at the center wavelength (λc) 302. In the described example, the samples are captured when the sampling_clk is logically low and near an end of the cycle when the sampling_clk is low, which permits the optical element 222 to reach or nearly reach the second temperature. When the samples are captured at times when the optical element 222 is at the second temperature, the lower loss of the response 306 at the magnitude 316, relative to the DC settings, results in more of the captured samples to be a logical "1". Hence, the counted number of logical "1"s being greater than or equal to half the total number of samples generally indicates that the center wavelength (λc) 302 of the optical signal is on the RHS of the optical response, like in FIG. 3A. The temperature settings (e.g., k_sel and/or duty_code) are responsively increased to generally cause the peak of the optical response of the optical element 222 to move towards the center wavelength (λc) 302 of the optical signal.

In the LHS scenario of FIG. 3B, samples captured when the optical element 222 is at the second temperature and has the second response 326 having the magnitude 336 at the center wavelength (λc) 302 have a greater loss relative to samples captured when the optical element 222 is at the first temperature and has the first response 324 having the magnitude 334 at the center wavelength (λc) 302. When the samples are captured at times when the optical element 222 is at the second temperature, the greater loss of the response 326 at the magnitude 336, relative to the DC settings, results in less of the captured samples to be a logical "1". Hence, the counted number of logical "1"s not being greater than or equal to half the total number of samples generally indicates that the center wavelength (λc) 302 of the optical signal is on the LHS of the optical response, like in FIG. 3B. The temperature settings (e.g., k_sel and/or duty_code) are responsively decreased to generally cause the peak of the optical response of the optical element 222 to move towards the center wavelength (λc) 302 of the optical signal.

A person having ordinary skill in the art can readily understand modifications (e.g., modifications to the implemented logic) to this temperature settings tracking. For example, if, at block 1252, samples are captured when the sampling_clk is high, the k_sel and/or duty code can be decreased when the counted number of logical "1"s is greater than or equal to half of the y number, and the k_sel and/or duty code can be increased when the counted number of logical "1"s is not greater than or equal to half of the y number.

As indicated by FIGS. 12A and 12B, DC settings tracking and temperature settings tracking are performed iteratively like shown in FIG. 5. Prior to performing DC settings tracking each iteration, the tia_dac_code and tia_ictrl are set or reset such that the tia_dac_code and tia_ictrl are determined independently of any previous value of tia_dac_code and tia_ictrl. Further, an iteration of the temperature settings tracking can build on values of the k_sel and duty_code generated by a pervious iteration of the temperature settings tracking. With the repeated iterations of DC settings tracking and temperature settings tracking, the device can continuously be recalibrated if, for example, an ambient temperature of an environment in which the device is disposed changes.

Figure 13:
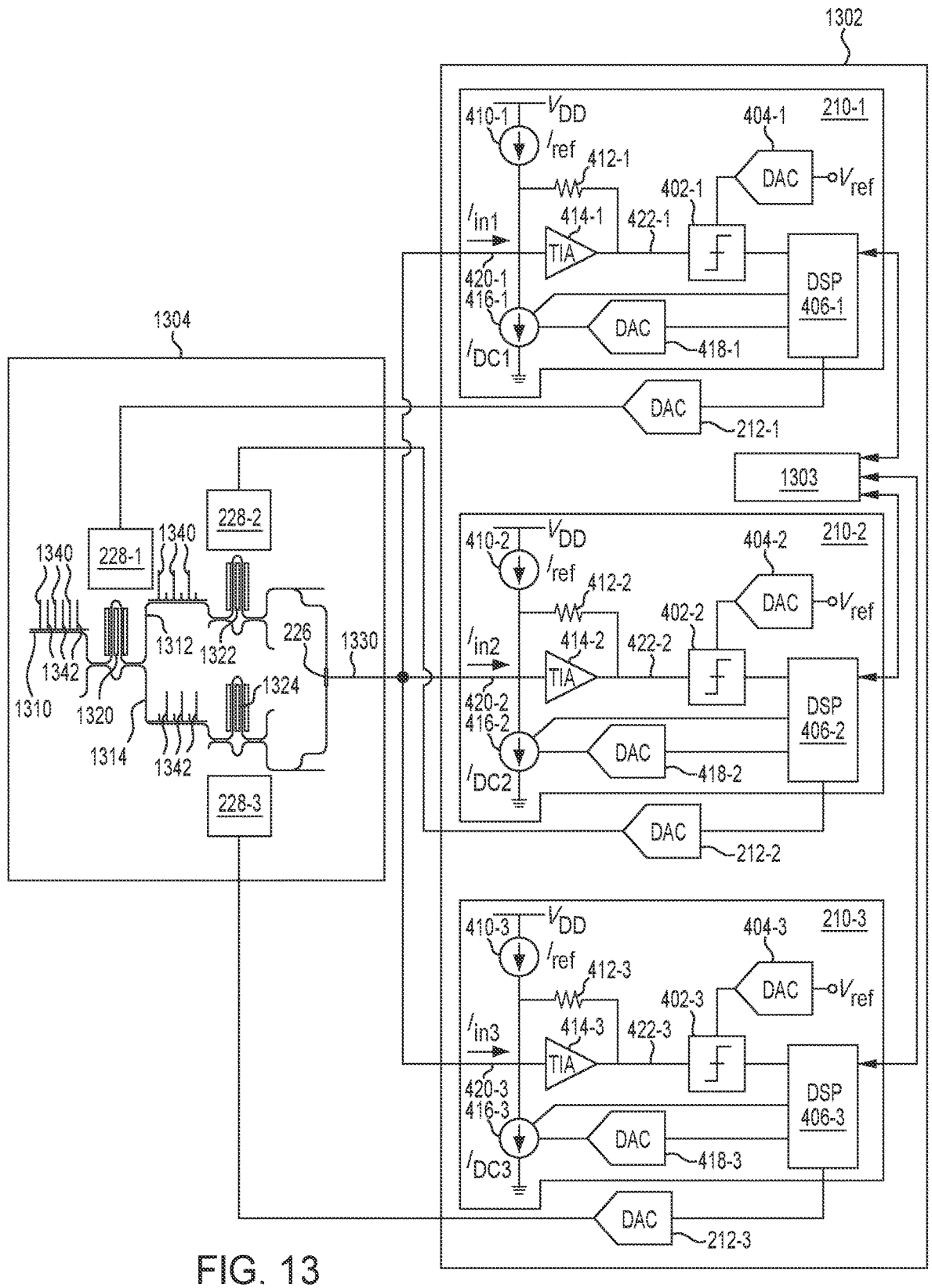
FIG. 13 is a simplified schematic of a device according to some examples.

FIG. 13 is a simplified schematic of a device according to some examples. The device (which may be in a package like in FIG. 1) includes an electrical IC 1302 on an electrical IC die 102 and an optoelectronic circuit 1304 on an optical die 104. The electrical IC includes controllers 210-1, 210-2, 210-3, DACs 212-1, 212-2, 212-3, and controller 1303. Each controller 210-1, 210-2, 210-3 and corresponding DAC 212-1, 212-2, 212-3 is configured and generally operates like the controller 210 and DAC 212 described above. The controller 1303 is communicatively coupled to the controllers 210-1, 210-2, 210-3 and is configured to control operations between the controllers 210-1, 210-2, 210-3. Although not illustrated, the electrical IC 1302 further includes a circuit to generate an electrical signal that is to be transmitted as an optical signal over an optical channel.

The optoelectronic circuit 1304 includes an optical source (not specifically illustrated), a common channel path 1310, an odd channel path 1312, an even channel path 1314, a Mech-Zehnder interferometer (MZI) wavelength splitter 1320, MZI filters 1322, 1324, a photodiode 226, and heaters 228-1, 228-2, 228-3. The heater 228-1 is disposed in the optical die 104 proximate the MZI wavelength splitter 1320. The heater 228-2 is disposed in the optical die 104 proximate the MZI filter 1322. The heater 228-3 is disposed in the optical die 104 proximate the MZI filter 1324.

The common channel path 1310 is configured to carry odd channel optical signals 1340 and even channel optical signals 1342. The MZI wavelength splitter 1320 is configured to receive the odd channel optical signals 1340 and even channel optical signals 1342 from the common channel path 1310 and split the odd channel optical signals 1340 to the odd channel path 1312 and the even channel optical signals 1342 to the even channel path 1314. The MZI filter 1322 is configured to receive the odd channel optical signals 1340 from the odd channel path 1312, suppress spurious even channel optical signals, and transmit the odd channel optical signals 1340 on an optical channel. The MZI filter 1324 is configured to receive the even channel optical signals 1342 from the even channel path 1314, suppress spurious odd channel optical signals, and transmit the even channel optical signals 1342 on an optical channel.

The photodiode 226 is disposed in the optical die 104 such that some portion of the optical signal output from the MZI filters 1322, 1324 is incident on the photodiode 226. The photodiode 226 is configured to generate an electrical current in response to the optical signal incident on the photodiode 226.

An output node 1330 of the photodiode 226 is electrically coupled to each input node 420-1, 420-2, 420-3 of the of the DC-controllable transimpedance stages of the controllers 210-1, 210-2, 210-3. The heater 228-1 is electrically coupled to the DAC 212-1; the heater 228-2 is electrically coupled to the DAC 212-2; and the heater 228-3 is electrically coupled to the DAC 212-3.

In operation, the photodiode 226 generates an electrical current in response to the optical signals from the MZI filters 1322, 1324 incident on the photodiode 226. The electrical current generated by the photodiode 226 is divided between and received by the controllers 210-1, 210-2, 210-3 at the input nodes 420-1, 420-2, 420-3 as a respective input current $I_{in1}$, $I_{in2}$, $I_{in3}$. Each controller 210-1, 210-2, 210-3 operates on the respective input current $I_{in1}$, $I_{in2}$, $I_{in3}$ like described above. The controller 1303 controls the controllers 210-1, 210-2, 210-3 to perform DC settings tracking and temperature settings tracking sequentially between the controllers 210-1, 210-2, 210-3.

Figure 14:
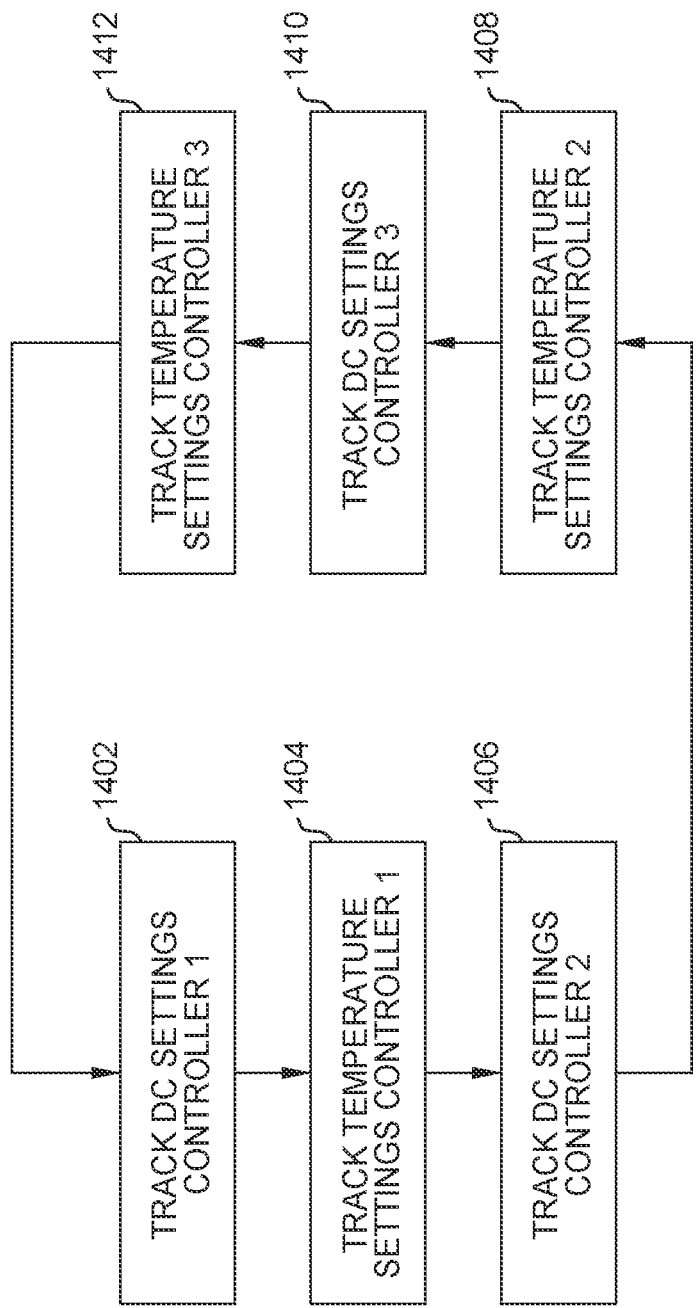
FIG. 14 is a flow chart of sequential operation of the device of FIG. 13 according to some examples.

FIG. 14 is a flow chart of this sequential operation according to some examples. At block 1402, DC settings tracking is performed by controller 210-1, and at block 1404, temperature settings tracking is performed by controller 210-1. At block 1406, DC settings tracking is performed by controller 210-2, and at block 1408, temperature settings tracking is performed by controller 210-2. At block 1410, DC settings tracking is performed by controller 210-3, and at block 1412, temperature settings tracking is performed by controller 210-3. The controller 1303 can coordinate and control which controller begins its DC settings tracking based on which controller has ended its temperature settings tracking. Each DC settings tracking for each controller 210-1, 210-2, 210-3 can be as described above individually, and each temperature settings tracking for each controller 210-1, 210-2, 210-3 can be as described above individually.

The example of FIGS. 13 and 14 therefore illustrate how a single photodiode can be implemented to control multiple, e.g., optical filters. This example illustrates that sequential operation of multiple controllers using a same photodiode can operate to control temperature of multiple, e.g., optical filters in an optical die.

While the foregoing is directed to specific examples, other and further examples may be devised without departing from the basic scope thereof, and the scope thereof is determined by the claims that follow.

What is claimed is:

1. A device comprising:
 a first controller comprising:
   a first DC-controllable transimpedance stage having an input node and an output node, the input node of the first DC-controllable transimpedance stage being configured to be electrically coupled to a photodiode;
   a first slicer circuit having an input node and an output node, the input node of the first slicer circuit being electrically coupled to the output node of the first DC-controllable transimpedance stage; and
   a first processor having an input node electrically coupled to the output node of the first slicer circuit, the first processor being configured to control the first DC-controllable transimpedance stage to reduce a DC component of a signal on the output node of the first DC-controllable transimpedance stage based on a signal on the output node of the first slicer circuit; and
 a first digital-to-analog converter (DAC) having an input node electrically coupled to an output node of the first processor and having an output node configured to be electrically coupled to a heater, the first processor being configured to control an output voltage on the output node of the first DAC based on the signal on the output node of the first slicer circuit.

2. The device of claim 1 further comprising:
 the photodiode electrically coupled to the input node of the first DC-controllable transimpedance stage;
 an optical element configured to pass an optical signal and having a temperature-dependent optical response, the optical element being disposed relative to the photodiode such that at least some of the optical signal is incident on the photodiode; and
 the heater electrically coupled to the output node of the first DAC, the heater being disposed proximate the optical element.

3. The device of claim 1, wherein the first DC-controllable transimpedance stage comprises:
 a transimpedance amplifier electrically connected between the input node of the first DC-controllable transimpedance stage and the output node of the first DC-controllable transimpedance stage; and a controllable current source electrically connected between the input node of the first DC-controllable transimpedance stage and a power supply node.

4. The device of claim 1, wherein the first processor is configured to control the output voltage on the output node of the first DAC to dither between different duty cycles.

5. The device of claim 1, wherein the first processor is configure to:
   iteratively:
      determine a DC setting for controlling the first DC-controllable transimpedance stage to reduce the DC component of the signal on the output node of the first DC-controllable transimpedance stage, the first processor being configured to control the first DC-controllable transimpedance stage to reduce the DC component of the signal on the output node of the first DC-controllable transimpedance stage using the DC setting; and
      after determining the DC setting, determine a temperature setting for controlling the output voltage on the output node of the first DAC, the first processor being configured to control the output voltage on the output node of the first DAC using the temperature setting.

6. The device of claim 1, wherein the first processor comprises:
   a tracking circuit configured to capture samples of the signal on the output node of the first slicer circuit, to generate a current-control setting of the first DC-controllable transimpedance stage based on first samples captured from the signal on the output node of the first slicer circuit, and to generate a duty code and a level selection code based on second samples captured from the signal on the output node of the first slicer circuit and subsequent to the first samples being captured; and
   a pulse width modulation circuit configured to generate a dither duty code and a dither level selection code based on the duty code and the level selection code and to generate a thermal code having a dither duty cycle output to the input node of the first DAC.

7. The device of claim 1 further comprising:
   a second controller comprising:
      a second DC-controllable transimpedance stage having an input node and an output node, the input node of the second DC-controllable transimpedance stage being electrically connected to the input node of the first DC-controllable transimpedance stage, the input node of the second DC-controllable transimpedance stage being configured to be electrically coupled to the photodiode;
      a second slicer circuit having an input node and an output node, the input node of the second slicer circuit being electrically coupled to the output node of the second DC-controllable transimpedance stage; and
      a second processor having an input node electrically coupled to the output node of the second slicer circuit, the second processor being configured to control the second DC-controllable transimpedance stage to reduce a DC component of a signal on the output node of the second DC-controllable transimpedance stage based on a signal on the output node of the second slicer circuit; and
      a second DAC having an input node electrically coupled to a first output node of the second processor and having an output node configured to be electrically coupled to a second heater, the second processor being configured to control an output voltage on the output node of the second DAC based on the signal on the output node of the second slicer circuit.

8. A method for controlling temperature of a device, the method comprising:
   generating, by a processor, a first DC setting that is output from the processor to a first DC-controllable transimpedance stage, the first DC-controllable transimpedance stage having an input node electrically coupled to a photodiode, the photodiode being configured to have incident thereon an optical signal passed from a first optical element, the first optical element having a temperature-dependent optical response, wherein the processor generates the first DC setting based on a signal on an output node of the first DC-controllable transimpedance stage; and
   after generating the first DC setting, generating, by the processor, a first temperature setting, wherein a first code output from the processor to a first digital-to-analog converter (DAC) is based on the first temperature setting, the first DAC having an output node electrically coupled to a first heater that is disposed proximate the first optical element, wherein the processor generates the first temperature setting based on the signal on the output node of the first DC-controllable transimpedance stage.

9. The method of claim 8, wherein generating the first DC setting and generating the first temperature setting are performed iteratively.

10. The method of claim 8 further comprising dithering a duty cycle of a voltage on the output node of the first DAC based on the first temperature setting.

11. The method of claim 8, wherein generating the first DC setting comprises:
   iteratively, until a vote counter is equal to a first predetermined amount:
      capturing a number of samples based on the signal on the output node of the first DC-controllable transimpedance stage;
      incrementing the vote counter when the captured samples of a respective iteration are within an error range;
      when a round counter is less than a second predetermined amount, incrementing the round counter; and
      when the round counter is equal to or greater than the second predetermined amount:
         adjusting the first DC setting; and
         resetting the vote counter and the round counter.

12. The method of claim 8, wherein generating the first temperature setting comprises:
   capturing a number of samples based on the signal on the output node of the first DC-controllable transimpedance stage; and
   adjusting the first temperature setting based on whether the captured samples have a majority of logical "1"s.

13. The method of claim 8, wherein the first DC-controllable transimpedance stage comprises:
   a transimpedance amplifier electrically connected between the input node of the first DC-controllable transimpedance stage and the output node of the first DC-controllable transimpedance stage; and
   a controllable current source electrically connected between the input node of the first DC-controllable transimpedance stage and a power supply node, the first DC setting controlling a current of the controllable current source.

14. The method of claim 8, wherein the first code is a thermal code having a duty cycle that dithers.

15. The method of claim 8 further comprising:
after generating the first temperature setting, generating a second DC setting that is output to a second DC-controllable transimpedance stage, the second DC-controllable transimpedance stage having an input node electrically coupled to the photodiode, the photodiode further being configured to have incident thereon an optical signal passed from a second optical element, the second optical element having a temperature-dependent optical response, wherein the second DC setting is generated based on a signal on an output node of the second DC-controllable transimpedance stage; and
after generating the second DC setting, generating a second temperature setting, wherein a second code output to a second DAC is based on the second temperature setting, the second DAC having an output node electrically coupled to a second heater that is disposed proximate the second optical element, wherein the second temperature setting is generated based on the signal on the output node of the second DC-controllable transimpedance stage.

16. A device comprising:
an optical element configured to pass an optical signal and having a temperature-dependent optical response;
a photodiode disposed relative to the optical element such that at least some of the optical signal through the optical element is incident on the photodiode;
a heater disposed proximate the optical element and configured to convert electrical energy to thermal energy;
a transimpedance stage, an input node of the transimpedance stage being electrically coupled to the photodiode, the transimpedance stage comprising a controllable current source electrically connected between the input node of the transimpedance stage and a power supply node;
a slicer circuit, an input node of the slicer circuit being electrically coupled to an output node of the transimpedance stage; and
a processor, an input node of the processor being electrically coupled to an output node of the slicer circuit, the processor being configured to control a current of the controllable current source based on an output signal on the output node of the slicer circuit and configured to control an amount of electrical energy provided to the heater based on the output signal on the output node of the slicer circuit.

17. The device of claim 16 further comprising a digital-to-analog converter (DAC), an input node of the DAC being electrically coupled to an output node of the processor, an output node of the DAC being electrically coupled to the heater, the processor being configured to control the amount of electrical energy provided to the heater by controlling an output voltage on the output node of the DAC.

18. The device of claim 17, wherein the processor is configured to output a thermal code on the output node of the processor electrically coupled to the input node of the DAC, the thermal code having a dithering duty cycle.

19. The device of claim 16, wherein the processor is configured to generate a first setting to control the current of the controllable current source, the processor being configured to generate the first setting by iteratively, until a vote counter is equal to a first predetermined amount:
capturing a number of first samples of the output signal on the output node of the slicer circuit;
incrementing the vote counter when the captured first samples of a respective iteration are within an error range;
when a round counter is less than a second predetermined amount, incrementing the round counter; and
when the round counter is equal to the second predetermined amount:
adjusting the first setting; and
resetting the vote counter and the round counter.

20. The device of claim 19, wherein the processor is configured to generate a thermal code to control the amount of electrical energy provided to the heater, the thermal code being output on an output node of the processor, the processor being configured to generate the thermal code by:
capturing a number of second samples of the output signal on the output node of the slicer circuit;
adjusting a selection setting based on whether the captured second samples have a majority of logical "1"s; and
generating the thermal code based on the selection setting.

* * * * *